(12) United States Patent
Kim et al.

(10) Patent No.: US 7,548,467 B2
(45) Date of Patent: Jun. 16, 2009

(54) BIAS VOLTAGE GENERATOR AND METHOD GENERATING BIAS VOLTAGE FOR SEMICONDUCTOR MEMORY DEVICE

(75) Inventors: Hye-Jin Kim, Yongin-si (KR);
Kwang-Jin Lee, Hwaseong-si (KR);
Woo-Yeong Cho, Suwon-si (KR);
Mu-Hui Park, Seocho-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/955,562

(22) Filed: Dec. 13, 2007

(65) Prior Publication Data

US 2008/0159017 A1    Jul. 3, 2008

(30) Foreign Application Priority Data

Dec. 28, 2006   (KR)   ...................... 10-2006-0136115
Jan. 11, 2007   (KR)   ...................... 10-2007-0003123

(51) Int. Cl.
*G11C 5/14*   (2006.01)

(52) U.S. Cl. .................. 365/189.09; 365/148

(58) Field of Classification Search .................. 327/134
See application file for complete search history.

(56) References Cited

U.S. PATENT DOCUMENTS

| | | | |
|---|---|---|---|
| 6,377,495 B1 * | 4/2002 | Lorenz | ................... 365/189.09 |
| 6,768,665 B2 | 7/2004 | Parkinson et al. | |
| 7,050,328 B2 | 5/2006 | Khouri et al. | |
| 7,196,924 B2 * | 3/2007 | Lai et al. | ..................... 365/145 |
| 2005/0030787 A1 | 2/2005 | Lowrey et al. | |
| 2006/0158948 A1 | 7/2006 | Fuji | |
| 2007/0297238 A1 * | 12/2007 | Cho et al. | ............... 365/185.23 |

* cited by examiner

*Primary Examiner*—Tan T. Nguyen
(74) *Attorney, Agent, or Firm*—Volentine & Whitt, PLLC

(57) ABSTRACT

There are provided a bias voltage generator, a semiconductor memory device having the bias voltage generator, and a method for generating the bias voltage. The bias voltage generator which generates the bias voltage to control a sensing current supplied to a memory cell for sensing data is characterized in that the bias voltage is output in response to an input voltage being applied, so that a slope of the bias voltage to the input voltage is different in at least two sections divided corresponding to a level of the input voltage.

20 Claims, 14 Drawing Sheets

BIAS VOLTAGE GENERATOR AND METHOD GENERATING BIAS VOLTAGE FOR SEMICONDUCTOR MEMORY DEVICE

CROSS-REFERENCE TO RELATED APPLICATION

This application claims the benefit of Korean Patent Application Nos. 10-2006-0136115 filed Dec. 28, 2006, and 10-2007-0003123 filed Jan. 11, 2007, the collective subject matter of which is hereby incorporated by reference.

BACKGROUND OF THE INVENTION

1. Field of the Invention

The present invention relates to a bias voltage generator and a method of generating a bias voltage for a semiconductor memory device. More particularly, the invention relates to a bias voltage generator having increased sensing margin and improved resolution of a resistance dispersion curve, as well as a related method of generating a bias voltage within a semiconductor memory device.

2. Discussion of Related Art

An ideal semiconductor memory device would have high data storage capacity but would operate with low power consumption. Accordingly, considerable research and development effort has been expended to develop densely integrated, nonvolatile memory devices. Emerging examples of such memory devices include the phase-change random access memory (PRAM), the resistive random access memory (RRAM), and the magnetic random access memory (MRAM).

The PRAM uses one or more phase-change material(s) to store data in relation to a material phase state. Current phase-change materials include chalcogenides which have a resistance that varies with a phase state which may be altered by application of thermal energy. One such material is GexSbyTez (hereinafter, referred to as "GST") which is an alloy of germanium (Ge), antimony (Sb) and tellurium (Te).

Phase-change materials capable of incorporation within a PRAM must be able to stably change phase states (e.g., between crystalline and amorphous states) very rapidly. In conventional PRAM devices, the phase-change material has high resistance in the amorphous state and low resistance in the crystalline state. As currently used in semiconductor memory devices, the amorphous state of the phase-change material may be defined as a 'RESET' state or data value of '1', and the crystalline state may be defined as 'SET' state or a data value of '0', or vice-versa.

Common memory cell types within a PRAM include a transistor structure or a diode structure. A memory cell having a transistor structure includes a phase-change material and an access transistor which are connected in series. A memory cell having a diode structure includes a phase-change material and a diode which are connected in series.

Compared to a PRAM memory cell having a transistor structure, a PRAM memory cell having a diode structure is capable of applying a relatively large write current which increases exponentially as a function of applied voltage. This greater write current capability allows relatively smaller diodes to be used in the implementation of an array of PRAM memory cells, thereby reducing the overall size of the constituent memory device. Therefore, it is expected that PRAM memory cells having a diode structure will be increasingly used in memory devices demanding a high integration density, a high operating speed, and low power consumption.

FIG. 1 illustrates a PRAM memory cell 50 having a diode structure. As shown in FIG. 1, PRAM memory cell 50 comprises a diode D and a variable resistor R. The variable resistor is implemented using one or more phase-change material(s).

Diode D forming memory cell 50 is connected between a word line WL and variable resistor R. That is, the cathode terminal of diode D is connected to the word line WL, and the anode terminal is connected to one end of the variable resistor R. The other end of the variable resistor R is connected to a bit line.

In a semiconductor memory device incorporating an array of memory cells like memory cell 50, a data write operation is performed using the reversible property of variable resistor R. That is, during a write operation applied to memory cell 50, electrical current is supplied through the bit line BL and the word line WL transitions to a low voltage level or a ground level. Then, a forward bias is applied to diode D, so that a current path is formed between the bit line BL and the word line WL. Then, the phase of variable resistor R is changed in relation to the current being applied and the application time of the current. Either 'SET data' indicated by a low resistance state or 'RESET data' indicated by a high resistance state may be stored in memory cell 50. In the working example, the SET data may be associated with a data value of '0' and the RESET data may be associated with a data value of '1', or vice versa.

A read operation may be used to determine a stored data value by distinguishing the state of memory cell 50. That is, the amount of current flowing through memory cell 50 is related to its resistance state. When RESET data is stored in memory cell 50, memory cell 50 has a high resistance value and the current passing through memory cell 50 is relatively small. However, when SET data is stored in memory cell 50, memory cell 50 has a low resistance value and the current passing through memory cell 50 is relatively large. Accordingly, data may be sensed according to the level of current passing through memory cell 50, or according to a voltage level change related to the level of current passing through memory cell 50.

The function of sensing data stored in a PRAM memory cell will be described in some additional detail with reference to an exemplary data read circuit for a PRAM device as illustrated in FIG. 2.

In FIG. 2, the data read circuit for a PRAM device comprises: a sense amplifier S/A, a current source 20, a clamping unit 10, a column selecting unit 40, and a cell array block 30.

The sense amplifier S/A may include a current sense amplifier or a voltage sense amplifier. The sense amplifier S/A senses data by comparing a voltage level at a sensing node Nsa, which is connected to a current path PA1 between the sensing node Nsa and a memory cell M, and a reference voltage level Vref. For example, when the voltage at sensing node Nsa applied to the input terminal of sense amplifier S/A is higher than the reference voltage Vref, a 'HIGH' data state is determined and output. When the voltage at sensing node Nsa is lower than the reference voltage Vref, a 'LOW' data state is determined and output at output terminal SAout. The 'HIGH' state indicates that memory cell M has a high resistance state, and the 'LOW' state indicates that memory cell M has the low resistance state.

Current source 20 is controlled by a bias voltage Vbias and supplies a sensing current Icell to the current path PA1. In the illustrated example, current source 20 includes a PMOS transistor PB which is connected to sensing node Nsa and a terminal Vsa to which a source voltage VDD or a high voltage VPP higher than the source voltage VDD is applied.

Clamping unit 10 includes clamp transistors NC controlled by a clamp signal Vclamp. The clamp transistors NC electrically connect any one memory cell from array block 30 which is selected from a plurality of cell array blocks forming array block 30 to sensing node Nsa of the sense amplifier S/A. Further, the clamp transistors NC maintain a specific voltage level so that the voltage of the bit line BL associated with the selected cell array block 30 is within the range of a threshold voltage Vth for the phase-change material. Therefore, the level of the clamp signal Vclamp is established consistent with the clamping function.

Column selecting unit 40 comprises a plurality of column selection transistors N0~Nn switched by column selection signals Y0~Yn. Column selection transistors N0~Nn form current path PA1 between the bit line BL1 associated with the selected memory cell M in selected cell array block 30 and sensing node Nsa which is connected through clamp transistor NC. That is, the current path PA1 between sensing node Nsa of the sense amplifier S/A and the memory cell M is formed by a switching operation applied to the clamp transistors NC and the column selection transistors N0~Nn. For example, when a column selection transistor N1 is turned ON by a column selection signal Y1, the current path PA1 is formed between the memory cell M and the sensing node Nsa.

Cell array block 30 includes memory cells which are disposed at the intersections of word lines WL0~WLn and bit lines BL0~BLn. Each memory cell may have a diode structure such as the one illustrated in FIG. 1.

The data read circuit performs the following to read data from the selected memory cell M in the cell array block 30.

When a read command, an address signal, and a clamp signal Vclamp are applied, the clamp signal Vclamp and the column selection signal Y1 are applied to form a current path PA1 between memory cell M and sensing node Nsa. At this time, the word line connected to memory cell M is maintained at ground level.

After current path PA1 is formed or at the same time at which current path PA1 is formed, a bias voltage Vbias is supplied to current source 20 to supply a current to the current path PA1. Accordingly, a sensing current (or penetrating current) Icell which depends on the resistance value of the memory cell M flows in the current path PA1.

The level of sensing current Icell flowing through current path PA1 varies in accordance with the data state of memory cell M (i.e., whether the memory cell M is in a reset data state or a set data state). When the memory cell M is in the reset data state, since it has a high resistance value, a small level of sensing current Icell flows through current path PA1. However, when the memory cell is in the set data state, it has a low resistance value and a relatively large level of sensing current Icell flows through the current path PA1. Accordingly, the voltage level of the sensing node Nsa which is connected to the input terminal of sense amplifier S/A is changed, and data sensing is performed by comparing the voltage level at the sensing node Nsa with the reference level Vref.

In the foregoing data read circuit, since the bias voltage Vbias controlling current source 20 supplying the sensing current Icell determines the amount of the current flowing through memory cell M and the voltage level at the sensing node Nsa, it must be carefully controlled. For example, when the selected memory cell M stores data indicated by a high resistance value (e.g., reset data or a data value of 1), the level of the bias voltage Vbias should be set so that the voltage level indicated at sensing node Nsa is higher than the reference voltage level Vref (e.g., one half the supply voltage (VDD/2)). However, when the selected memory cell M stores data indicated by a low resistance value (e.g., set data or a data value of 0), the level of the bias voltage Vbias should be set so that the voltage level indicated at sensing node Nsa is lower than the reference voltage level Vref. This does not mean that the bias voltage Vbias should be set to different levels depending on data state. Rather, this means that the bias voltage Vbias should be set to a fixed level for data sensing that meets the above conditions.

FIG. 3 is a bias voltage plot (G10) for resistance value points at which the voltage level at sensing node Nsa relative to the input bias voltage Vbias and the reference voltage level Vref applied in FIG. 2. The graph indicates SET and RESET states representing an exemplary resistance dispersion for set data and reset data.

In FIG. 3, the graphs of SET and RESET states showing the resistance dispersion for set and reset data are illustrated on a log scale. In the illustrated example, the set data graph SET has a resistance dispersion within a range of between 0 to 10K$\Omega$, and the reset data graph RESET has a resistance dispersion in a range of between 50K$\Omega$ to 1 M$\Omega$, or more. Therefore, as illustrated by the plot G10, the level of the bias voltage Vbias should be set such that the resistance value at a point at which the voltage level of the sensing node Nsa becomes the reference voltage level Vref falls within a range of between 10K$\Omega$ to 50K$\Omega$. In this case, a bias voltage level margin range "S" is indicated between about 1.4 to 2.3V. This is a relatively small margin range and should be increased to improve performance of the memory cell.

In other PRAM implementations, each constituent memory cell is capable of storing multiple bits of data. Such implementations exacerbate the difficulties of providing a bias voltage definition capable of sensing multi-bit data with acceptable margins.

One example is described with reference to FIGS. 4 and 5. FIG. 4 is a graph containing a comparative plot (G10) showing a resistance value of the point at which the voltage level of the sensing node Nsa to the input bias voltage Vbias of FIG. 2 becomes the reference voltage level Vref. FIG. 5 is a distribution plot for multi-bit data states 00, 01, 10 and 11 by each bit, corresponding to the input bias voltage Vbias. Collectively, FIGS. 4 and 5 illustrate a memory cell capable of storing 2-bit data in four states 00, 01, 10 and 11, or first data 00, second data 01, third data 10, and fourth data 11.

In the working example, it is assumed that the first data 00 is indicated by a resistance dispersion of 0 to R1, second data 01 is indicated by a resistance dispersion of R2 to R3, third data 10 is indicated by a resistance dispersion of R4 to R5, and fourth data 11 is indicated by a resistance dispersion of R6 or more. It may be further assumed that the relation R1<R2<R3<R4<R5<R6 is satisfied.

As illustrated in FIGS. 4 and 5, the first data 00 is distributed across a first section I in which the level of the input bias voltage Vbias is lowest, second data 01 is distributed across a second section II in which the level of the input bias voltage is higher than the first section I, third data 10 is distributed across a third section III in which the level of the input bias voltage is higher than the second section II, and fourth data 11 is distributed across a fourth section IV in which the level of the input bias voltage is higher than the third section III.

A first sensing section S1 which is a level section of the bias voltage Vbias for sensing the first data 00 and the other data 01, 10 and 11 is positioned between the first section I and the second section II. When a voltage with a specific level within the first sensing section S1 is applied as the bias voltage Vbias, it is sensed whether the data stored in the memory cell is the first data 00, or any one of the second data 01, the third data 10, and the fourth data 11.

Further, a second sensing section S2 for sensing between the first and second data 00 and 01 or the third and fourth data 10 and 11 is positioned between the second section II and the third section III. When a voltage with a specific level within the second sensing section S2 is applied as the bias voltage Vbias, it is sensed whether the data stored in the memory cell is any one of the first and second data 00 and 01 or any one of the third and fourth data 10 and 11. When the sensing operation is performed by the bias voltage Vbias of the first sensing section S1 and the bias voltage Vbias of the second sensing section S2 and when the data stored in the memory cell is the first data 00 or the second data 01, it is sensed.

Next, a third sensing section S3 for distinguishing the first, second and third data 00, 01 and 10 from the fourth data 11 is positioned between the third section III and the fourth section IV. When a voltage with a specific level within the third sensing section S3 is applied as the bias voltage Vbias, it is sensed that whether the data stored in the memory cell is any one of the first, second and third data 00, 01 and 10 or the fourth data 11. When the data stored in the memory cell is the fourth data 11, the data is sensed by the sensing operation through the bias voltage Vbias of the third sensing section S3. However, when the data stored in the memory cell is the other data 00, 01 and/or 10, it is necessary to apply the bias voltage Vbias of the second sensing section S2 or/and the bias voltage Vbias of the first sensing section S1 for sensing the other data 00, 01 and/or 10.

In the graph G10 of the resistance value illustrated in FIG. 4, each of the first sensing section S1 and the second sensing section S2 has an adequate range, but the third sensing section S3 has a narrow range. The reason for result relates to the slope of the plot G10 for the resistance value as it increases from a proximate range of the third sensing section S3 by the threshold voltage of the PMOS transistor which is part of current source 20. This problem occurs when current source 20 is formed of the transistor. Although this problem does impact the determination between binary data states, when storing a greater number of data states per memory cell, a sensing section having a narrow range, like the third sensing section S3 in the illustrated example results. Moreover, the distribution range of the data in each section is not constant as is shown in FIG. 5. That is, the third section III where the third data 10 is distributed and the fourth section IV where the fourth data 11 is distributed are much narrower in range, compared to the first section I where the first data 00 is distributed and the second section II where the second data 01 is distributed. Moreover, since the third sensing section S3 which is the sensing section between the third section III and the fourth section IV is formed in a narrow range, the sensing margin is small.

SUMMARY OF THE INVENTION

In one embodiment, the invention provides a bias voltage generator generating a bias voltage to control a sensing current supplied to a memory cell, comprising; a circuit providing the bias voltage in response to an applied input voltage, such that the slope of the bias voltage relative to the input voltage is different for at least two sections of the input voltage distinguished different voltage levels.

In another embodiment, the invention provides a semiconductor memory device comprising; a memory cell characterized by different resistance values defined by different data values stored in the memory cell, a sense amplifier sensing a stored data value in accordance with a level of current or voltage associated with a current path formed between a sensing node and the memory cell, a power source controlled by a bias voltage and supplying a sensing current to the current path, and a bias voltage generator outputting the bias voltage in response to an applied input voltage by controlling the slope of the bias voltage relative to defined sections distinguished by the level of the input voltage.

In another embodiment, the invention provides a method of generating a bias voltage to control a sensing current supplied to a memory cell, comprising; outputting the bias voltage in response to an applied input voltage by controlling the slope of the bias voltage in relation to a plurality of sections respectively defined in relation to the level of the input voltage.

In another embodiment, the invention provides a multi-level bias voltage generator generating a plurality of bias voltages to control a sensing current supplied to a memory cell storing multi-bit data, comprising; a circuit defining a sensing section selected from a plurality of sensing sections between two non-sensing sections selected from a plurality of non-sensing sections, wherein each one of the plurality of sensing sections corresponds to a bias voltage having a different slope selected from the plurality of bias voltages and corresponding to a level of an applied input voltage, such that the slope of the bias voltage in each sensing section is lower than the slope of the bias voltage in each non-sensing section.

DESCRIPTION OF EMBODIMENTS

Embodiments of the invention will now be described with reference to the accompanying drawings. The invention may, however, be embodied in many different forms and should not be construed as being limited to only the illustrated embodiments. Rather, these embodiments are presented as teaching examples.

Various embodiments of the invention may be applied to a variety of semiconductor memory devices having a structure that allows the sensing data stored in a memory cell using a resistance value. Examples of such semiconductor memory device include those having a transistor structure or a diode structure. One example of many possible applications will be described in the context of a phase-change random access memory (PRAM) device. However, the scope of the invention is not limited to only PRAM devices.

Figure 6:
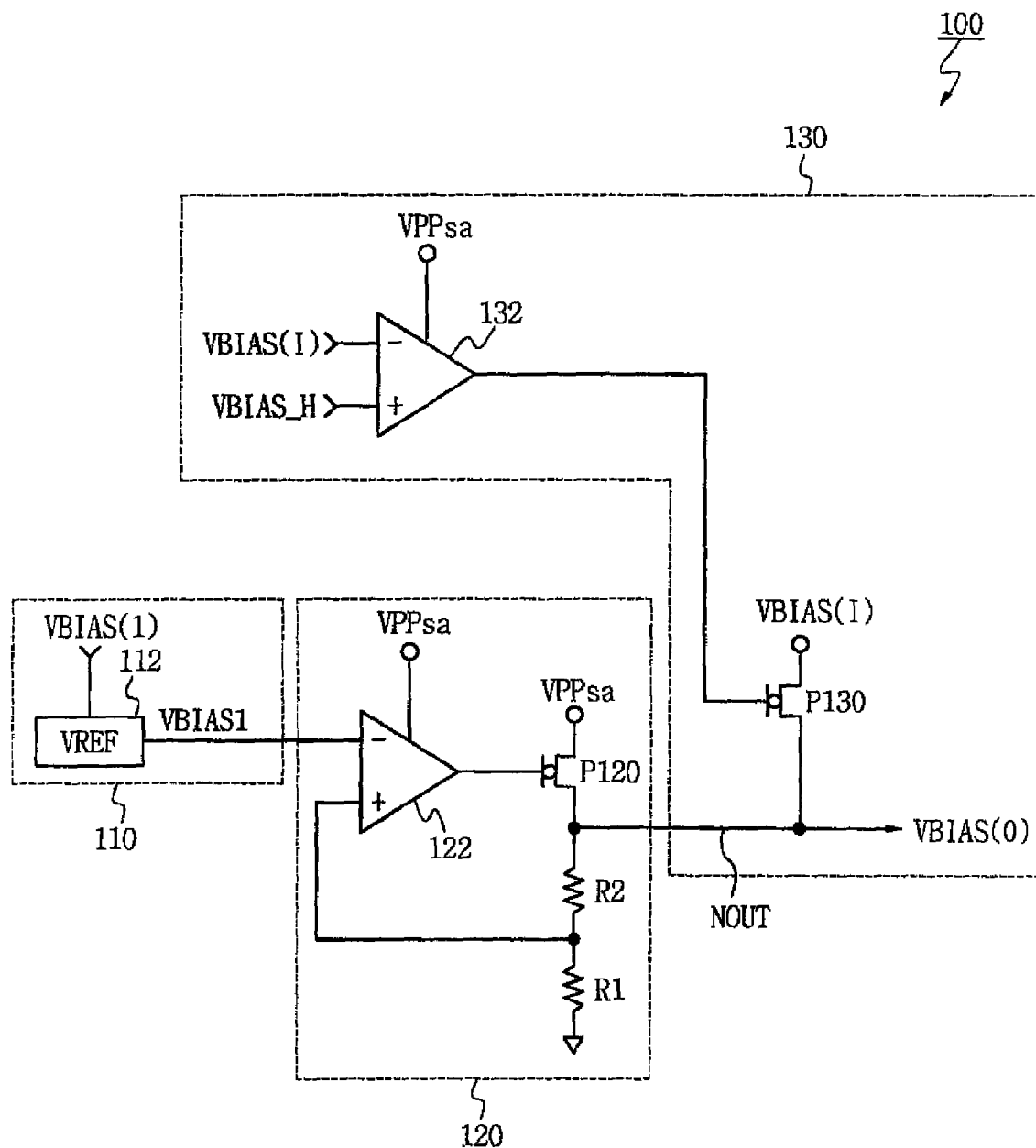
FIG. 6 is a circuit diagram of a bias voltage generator according to an exemplary embodiment of the present invention.

FIG. 6 is a circuit diagram of a bias voltage generator 100 according to an embodiment of the invention. The bias voltage generator 100 controls a sensing current applied to a data read circuit, such as the one illustrated in FIG. 2.

Figure 2:
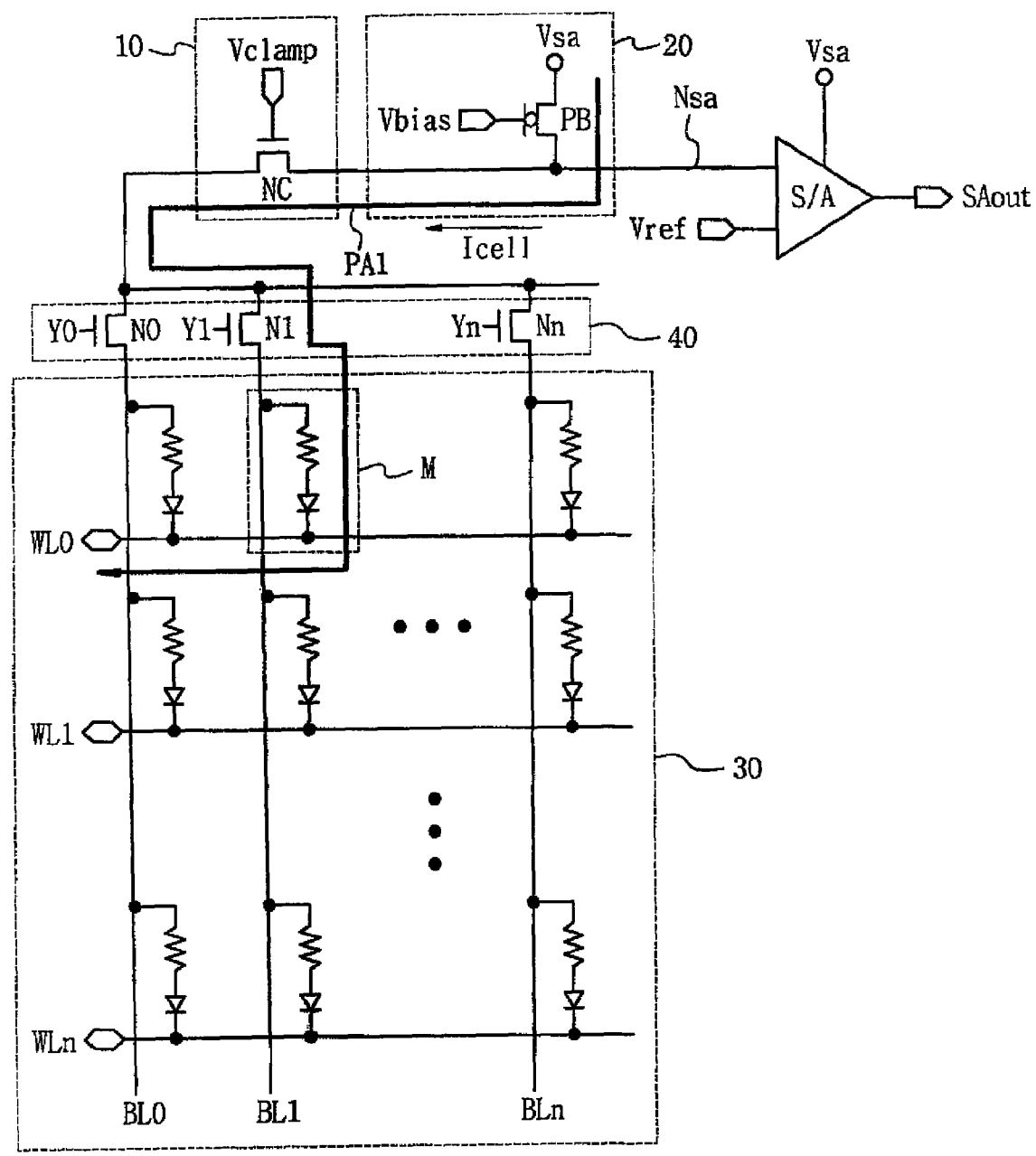
FIG. 2 illustrates a data reading circuit in a general PRAM device.

For example, bias voltage generator 100 of FIG. 6 may be applied to generate the bias voltage Vbias applied to a current source like the one illustrated in FIG. 2.

Bias voltage generator 100 outputs a bias voltage VBIAS (O) in response to an applied input voltage VBIAS (I), and comprises a detecting unit 110, an amplification unit 120, and a compensation unit 130. Of note, bias voltage VBIAS (O) may be output with a different slope in relation to different levels of input voltage VBIAS (I).

Detecting unit 110 comprises a detecting circuit 112 outputting the input voltage VBIAS (I) when the level of the input voltage VBIAS (I) is below a first level VBIAS_L, without addition and subtraction, but also outputting the input voltage VBIAS (I) when the level of the input voltage VBIAS (I) greater than or equal to the first level VBIAS_L by clamping the input voltage VBIAS (I) to the first level VBIAS_L or a proximate level to the first level VBIAS_L. The reference level of clamping in detecting unit 110 may be set to be a specific different level from that of the first level VBIAS_L.

The threshold below the first level VBIAS_L may be replaced with a threshold wherein the level of the input voltage VBIAS (I) is equal to or less than the first level VBIAS_L, and the threshold greater than or equal to the first level VBIAS_L may be replaced with a threshold of greater than the first level VBIAS_L.

The first level VBIAS_L may indicate the level of the input voltage VBIAS (I) which corresponds to the resistance value of the point at which the voltage level of the sensing node Nsa in FIG. 2 becomes the reference voltage level Vref. In other words, the first level VBIAS_L may be the level of the input voltage VBIAS (I) which corresponds to the minimum resistance value of the resistance values which are within the sensing range (for example, within the range of 10KΩ to 50KΩ). In other embodiments, the first level VBIAS_L may indicate a level which is same as a voltage level corresponding to the maximum resistance value of the set data or a level which is higher than a predetermined level. As an example, when the maximum resistance value in the resistance dispersion of the set data is 10KΩ, the first level VBIAS_L may be the level of the input voltage VBIAS (I) which corresponds to the maximum resistance value of 10KΩ. In this embodiment, although the first level VBIAS_L is set on the basis of the input voltage VBIAS (I), it may be set on the basis of the bias voltage VBIAS (O).

Accordingly, until the level of the input voltage VBIAS (I) becomes the first level VBIAS_L, the level of an output signal VBIAS1 of the detecting unit 110 increases to be same as the level of the input voltage VBIAS (I) at a constant slope. When the level of the input voltage VBIAS (I) is higher than the first level VBIAS_L, the input voltage VBIAS (I) is clamped to the first level VBIAS_L or a proximate level of the first level VBIAS_L.

Amplification unit 120 amplifies the output signal VBIAS1 of detecting unit 110 at a predetermined rate, to output the bias voltage VBIAS (O). Amplification unit 120 in the illustrated example of FIG. 6 comprises an OP amplifier circuit 122, a PMOS transistor P120 and resistors R1 and R2.

OP amplifier circuit 122 has a connection structure in which the output signal VBIAS1 from detecting unit 110 is input in the (−) input terminal and a (+) input terminal forms a feedback loop. PMOS transistor P120 has a connection structure for supplying a current to an output node NOUT of the bias voltage VBIAS (O) by control of the output signal of OP amplifier circuit 122. That is, PMOS transistor P120 may be connected between the terminal of the same level VPPsa as an operation source level of OP amplifier circuit 122 and the output node NOUT of the bias voltage VBIAS (O). The operation source level VPPsa of OP amplifier circuit 122 may be the level of the source voltage VDD of a general semiconductor memory device or a level VPP being higher than the level of the source voltage VDD.

The resistors R1 and R2 are connected to each other in a series between the output node NOUT of the bias voltage VBIAS (O) and the ground terminal. The (+) input terminal of the OP amplifier circuit 122 is connected to a connection region of the resistors R1 and R2.

The resistors R1 and R2 act as the elements of determining the slope of the bias voltage VBIAS (O) to the input voltage VBIAS (I). That is, the resistance values of resistors R1 and R2 determine the slope. Therefore, the slope is controllable by changing the values of resistors R1 and R2.

Thus, for the illustrated example, amplification unit 120 amplifies the output signal VBIAS1 of detecting unit 110 at the rate of (1+R2/R1). That is, the output signal of amplification unit 120 is output as the level of '(1+R2/R1)* (VBIAS1)'.

Compensation unit 130 may be used to increase the resolution of the resistance dispersion curve. Compensation unit 130 supplies the current to the output node NOUT of the bias voltage VBIAS (O) which is the output terminal of amplification unit 120 to increase the level of the bias voltage VBIAS (O).

Compensation unit 130 does not operate when the level of the input voltage VBIAS (I) is below a second level VBIAS_H, but operates when the level of the input voltage VBIAS (I) is greater than or equal to the second level VBIAS_H.

Compensation unit 130 comprises a differential amplifier 132 and a PMOS transistor P130 for supplying a compensating current. When the input voltage VBIAS (I) is input in the (−) input terminal and a fixed voltage of the second level VBIAS_H is input in the (+) input terminal, differential amplifier 132 amplifies the differential between the input voltage VBIAS (I) and the second level VBIAS_H, to be output.

PMOS transistor P130 is connected between the terminal for applying the input voltage VBIAS (I) and the output node NOUT of the bias voltage VBIAS (O). PMOS transistor P130 is designed to have a proper threshold voltage Vth, so that PMOS transistor P130 does not operate when the level of the input voltage VBIAS (I) is below the second level VBIAS_H, but operates only when the level of the input voltage VBIAS (I) is greater than or equal to the second level VBIAS_H. For example, when the output of the differential amplifier has a positive (+) voltage level, PMOS transistor P130 may be designed with a threshold voltage that precludes PMOS transistor P130 from being turned ON.

As described above, compensation unit 130 supplies the compensating current to the output node NOUT of the bias voltage VBIAS (O) only when the level of the input voltage VBIAS (I) is greater than or equal to the second level VBI- AS_H. Further, as the level difference between the input voltage VBIAS (I) and the second level VBIAS_H becomes greater, compensation unit 130 increasingly supplies the current to the output node NOUT of the bias voltage VBIAS (O).

The second level VBIAS_H is a predetermined level which is higher than the first level VBIAS_L. The second level VBIAS_H indicates a level of the input voltage VBIAS (I) corresponding to the resistance value of the point at which the voltage level at sensing node Nsa in FIG. 2 becomes the reference voltage level Vref. In other words, the second level VBIAS_H may indicate a level of the input voltage VBIAS (I) corresponding to the maximum resistance value among the resistance values within the sensing range (for example, within the range of 10KΩ~50KΩ). In another meaning, the second level VBIAS_H may mean a level which is the same as or lower than the voltage level corresponding to the minimum resistance value of the reset data. As an example, when the minimum resistance value in the resistance dispersion of the reset data is 50KΩ, the second level VBIAS_H may be the level of the input voltage VBIAS (I) which corresponds to the minimum resistance value of 50KΩ.

In the illustrated embodiment, although the second level VBIAS_H is set on the basis of the input voltage VBIAS (I), it may alternately be set on the basis of the bias voltage VBIAS (O).

The bias voltage VBIAS (O) being output through the output node NOUT of the bias voltage VBIAS (O) may be input as the bias voltage Vbias to control power source 20 for supplying the sensing current Icell to the current path PA1, as illustrated in FIG. 2.

Figure 7:
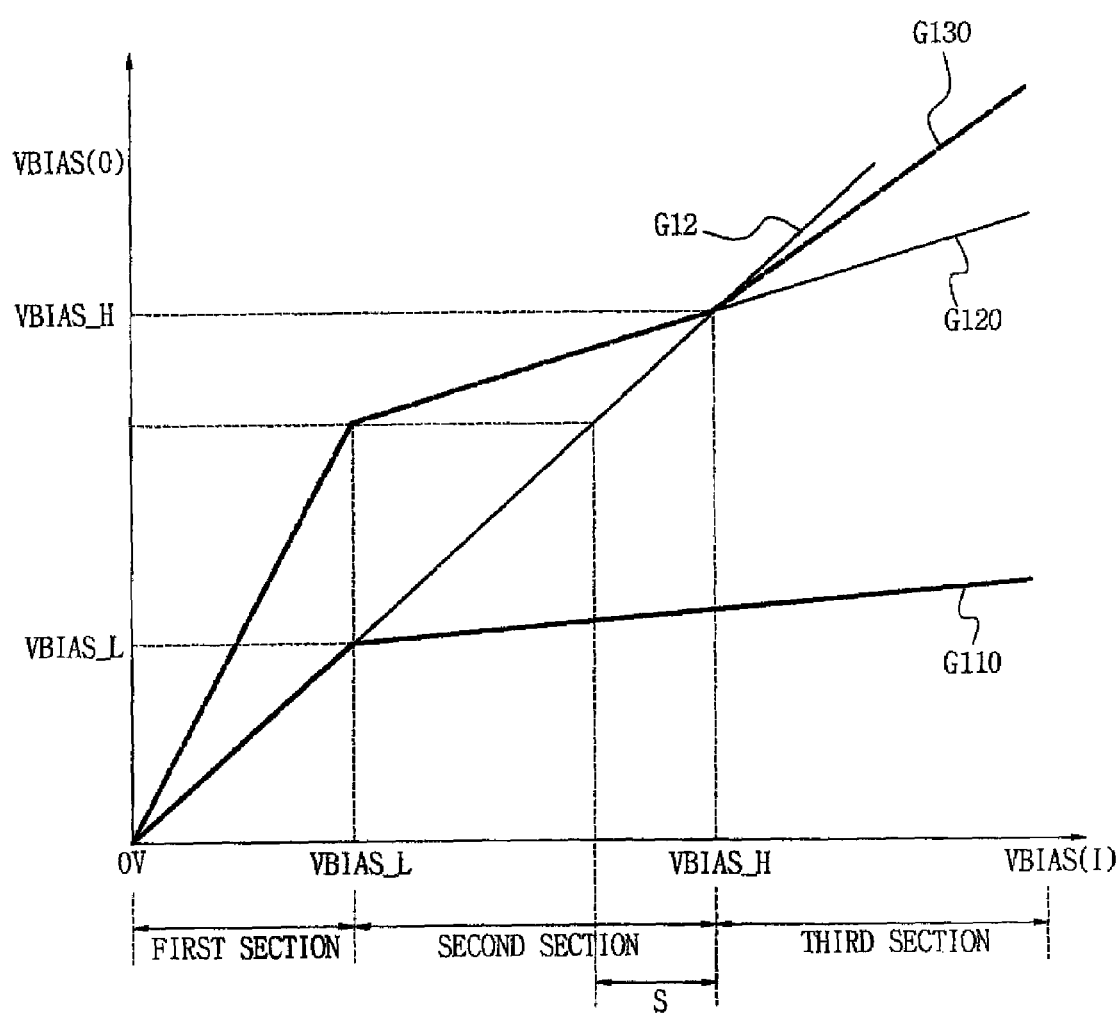
FIG. 7 shows graphs representing an operation by each section of FIG. 6.

The operation of bias voltage generator 100 will now be described with respect to each voltage "section" of the exemplary graph shown in FIG. 5. FIG. 7 includes plots G110, G120 and G130 respectively indicating the output of detecting unit 110 and the output of amplification unit 120 constituting the bias voltage generator 100 of FIG. 6, and the final output of the bias voltage generator 100.

For clarity, the section in which the level of the input voltage VBIAS (I) is below the first level VBIAS_L is defined as a first section I, the section in which the level of the input voltage VBIAS (I) is the first level VBIAS_L or above and is the second level VBIAS_H or below is defined as a second section II, and the section in which the level of the input voltage VBIAS (I) is in excess of the second level VBIAS_H is defined as a third section III.

In FIG. 7, the plot G12 represents the input voltage VBIAS (I), the plot G10 represents the output signal VBIAS1 of detecting unit 110 to the input voltage VBIAS (I), the plot G120 represents the output signal of amplification unit 120, and the plot G130 represents the level of the bias voltage VBIAS (O) which is the final output signal of bias voltage generator 100 when it comprises compensation unit 130. It is assumed that the input voltage VBIAS (I) is applied with a linear, constant slope as indicated by the plot G12.

In the first section I, only detecting unit 110 and amplification unit 120 operate. As the input voltage VBIAS (I) is input at the constant slope, the output signal VBIAS1 with the same level as that of the input voltage VBIAS (I) is output by detecting unit 110. The output signal VBIAS1 of detecting unit 110 in the first section I has the same slope as that of the input signal VBIAS (I).

Then, amplification unit 120 amplifies the output signal VBIAS1 provided by detecting unit 110 at the predetermined rate of (1+R2/R1) and outputs the amplified output signal. Accordingly, the output signal of amplification unit 120 in the first section I has a greater slope than that of the output signal VBIAS1 of detecting unit 110. The slope of the output signal for amplification unit 120 is controllable depending on a rate change of a resistance value included within amplification unit 120. Since compensation unit 130 does not operate in the first section I, the output signal of amplification unit 120 becomes the bias voltage VBIAS (O) which is the final output of the bias voltage generator 100.

Next, in the second section II like the first section I, only detecting unit 110 and amplification unit 120 operate. However, when the input voltage VBIAS (I) reaches the first level VBIAS_L, detecting unit 110 outputs the output signal VBIAS1 by clamping the input voltage VBIAS (I) to the first level VBIAS_L or a proximate level to the first level VBIAS_L, as shown in plot G110. That is, the slope of the output signal VBIAS1 provided by detecting unit 110 in the second section II may have a value being nearly '0' or a proximate value to '0'. The first level VBIAS_L is an important element to determine a sensing margin of the bias voltage VBIAS (O). Therefore, the first level VBIAS_L may be changed to have a suitable level, if necessary.

Then, amplification unit 120 amplifies the output signal VBIAS1 provided by detecting unit 110 at the predetermined rate of (1+R2/R1) and outputs the amplified output signal. Accordingly, as shown by plot G120, the output signal of amplification unit 120 in the second section II has a lower slope than that of the output signal of amplification unit 120 in the first section I.

The slope of the output signal provided by amplification unit 120 is controllable depending on a rate change for a resistance value within amplification unit 120. Since compensation unit 130 does not still operate in the second section II, the output signal of amplification unit 120 becomes the bias voltage VBIAS (O) which is the final output of the bias voltage generator 100.

Next, in the third section III, unlike the first section I and the second section II, compensation unit 130 operates. That is, when the input voltage VBIAS (I) reaches the second level VBIAS_H, compensation unit 130 operates. The operation of detecting unit 110 and amplification unit 120 are the same as those in the second section II, but compensation unit 130 additionally operates.

Thus, detecting unit 110 outputs the output signal VBIAS1 by clamping the input voltage VBIAS (I) to the first level VBIAS_L or the proximate level to the first level VBIAS_L, as shown in plot G110. Amplification unit 120 amplifies the output signal VBIAS1 provided by detecting unit 110 at the predetermined rate of (1+R2/R1) and outputs the amplified output signal. Accordingly, as indicated by the plot G120, the output signal from amplification unit 120 in the third section III has a much lower slope than that of the output signal of amplification unit 120 in the first section I.

Then, compensation unit 130 supplies a current in proportion to the level difference between the input voltage VBIAS (I) and the second level VBIAS_H to the output node NOUT of the bias voltage VBIAS (O). Accordingly, as indicated by plot G130, the voltage level of the output node NOUT of the bias voltage VBIAS (O) in the third section III is increased, and the slope is greater than that in the second section II.

Thus, as indicated by the plot G130, the bias voltage VBIAS (O) being output by bias voltage generator 100 has a slope relative to the input voltage VBIAS (I) which is lower in the second section II than the first and third sections I and III.

Figure 3:
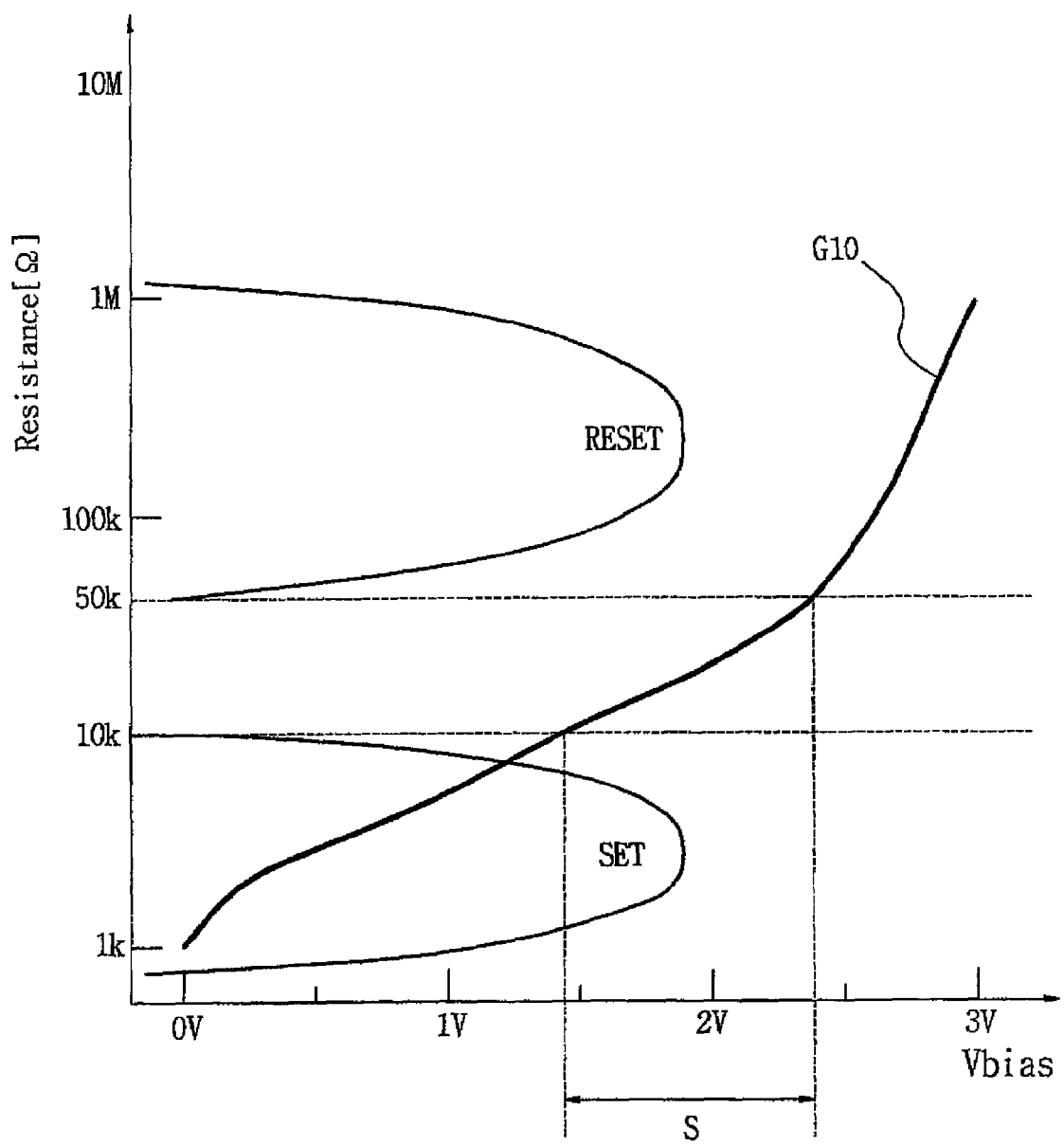
FIG. 3 shows graphs representing a resistance value of a bias voltage of FIG. 2 and the resistance dispersion of set data and reset data.
Figure 8:
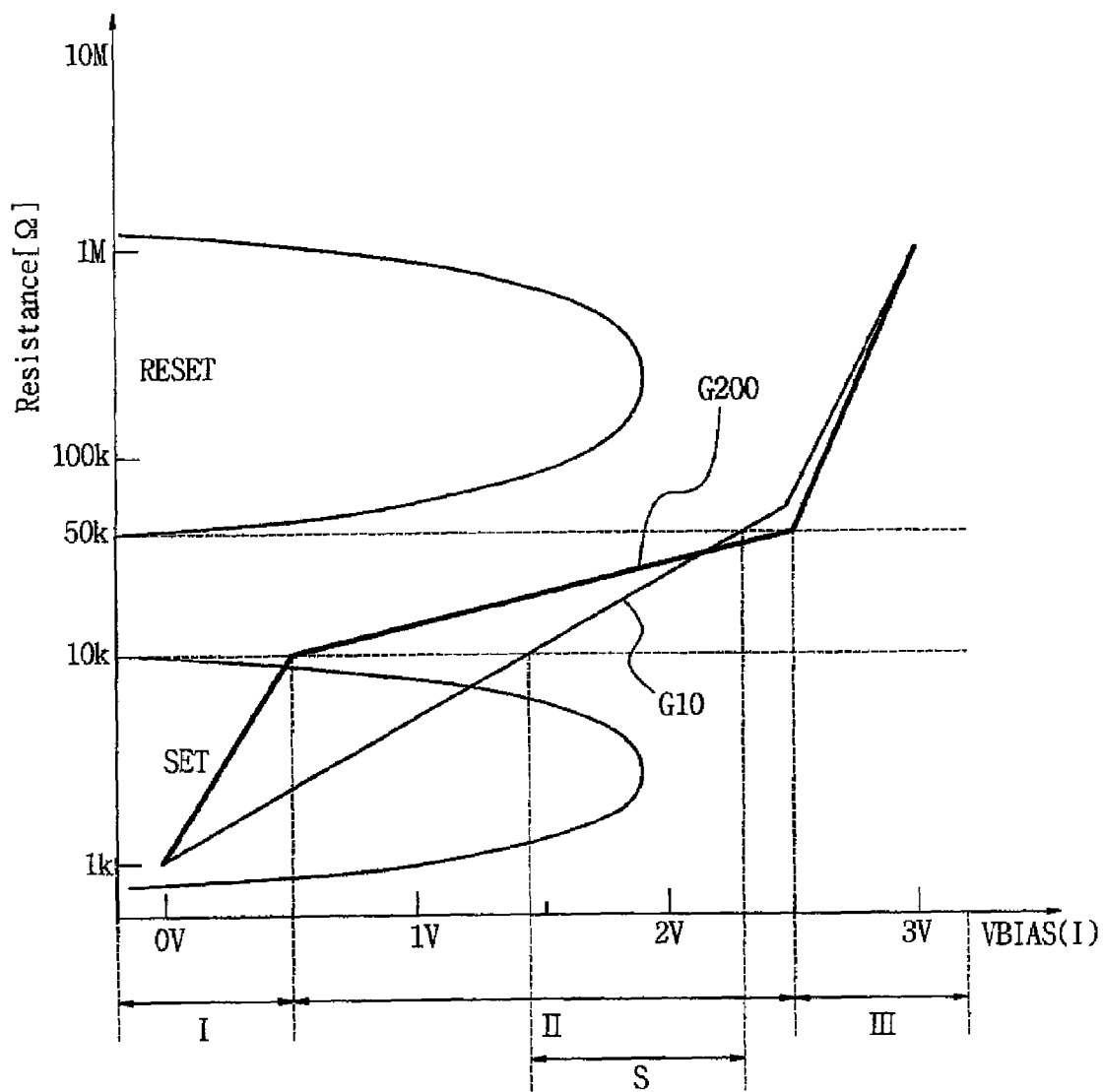
FIG. 8 shows graphs representing a resistance value of a bias voltage of FIG. 6 and the resistance dispersion of set data and reset data.

FIG. 8 is a graph which may be compared to the graph of FIG. 3. FIG. 8 adds plot G200 to the plots shown in FIG. 3. Plot G200 illustrates the resistance value of the point at which the voltage level at sensing node Nsa of FIG. 2 becomes the reference voltage level to the input voltage VBIAS (I). It is assumed that the input voltage VBIAS (I) is same as the input bias voltage Vbias of FIG. 3. In other words, in the plot G10, the input bias voltage Vbias is applied to power source 20, and in the plot G200, the bias voltage VBIAS (O) output from bias voltage generator 100 is input to power source 20.

As illustrated in FIG. 8, SET and RESET conditions representing set data and reset data stored in a constituent memory cell are illustrated on a Log scale. In general, the set data graph SET has the resistance dispersion within the range of 0~10KΩ, and the reset data graph RESET has the resistance dispersion within the range of 50KΩ~1 MΩ or more. As explained with reference to FIG. 3, in plot G10, the range S of the input voltage level is established at 1.4 to 2.3V. However, as shown by the plot G200, when a bias voltage generator according to an embodiment of the invention is used to similar purpose, the range of the input voltage level may be established in a range of between 0.5 to 2.5V which is the range of the second section II. Therefore, it is noted that the range of the input voltage level provided by an embodiment of invention is expanded, as compared with the range conventionally provided. That is, an increased sensing margin relative to an applied input voltage is provided.

Figure 9:
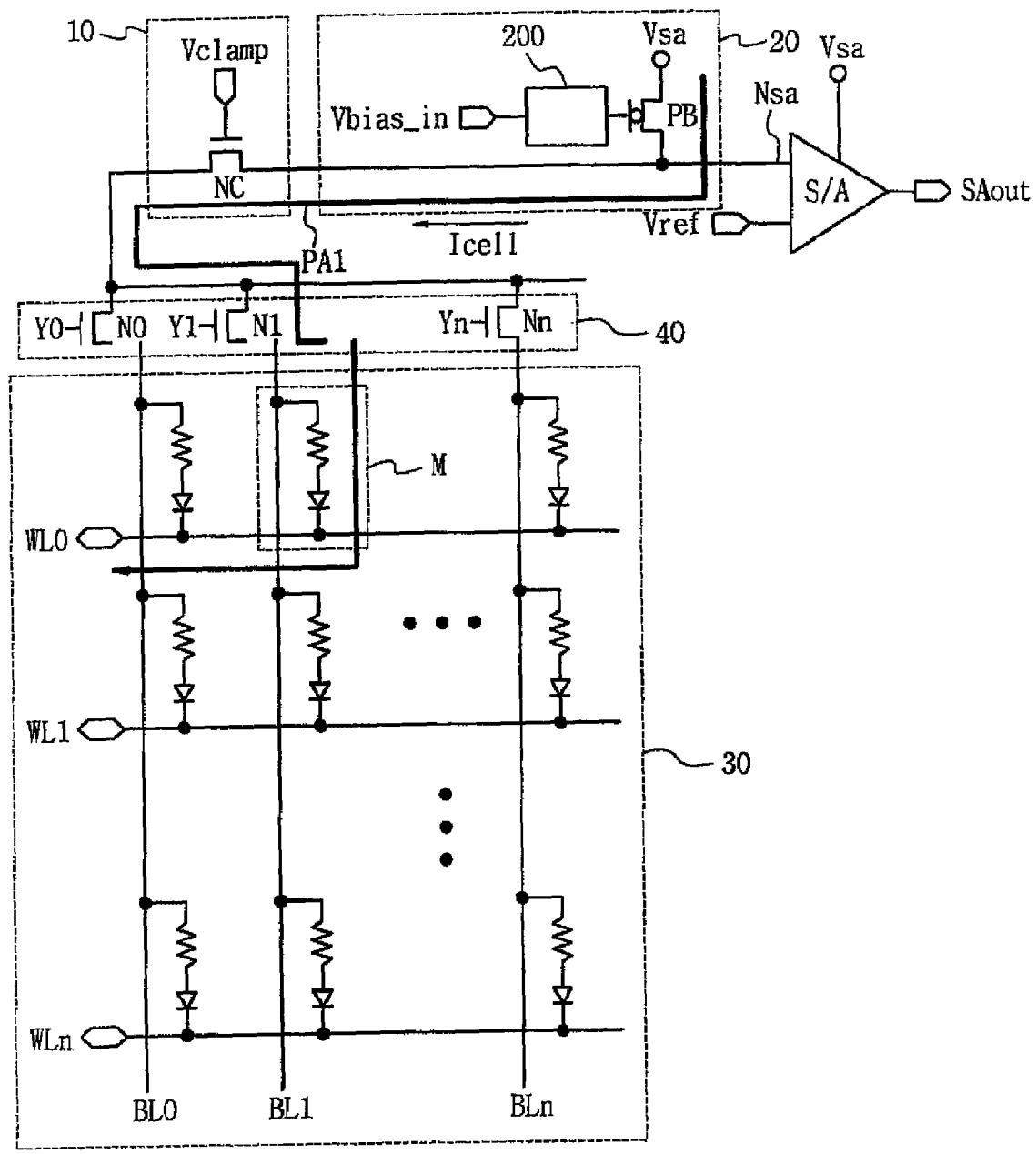
FIG. 9 is a schematic view of a semiconductor memory device according to another exemplary embodiment of the present invention.

A multi-level storing memory cell to which other exemplary embodiments of the present invention are applied will be described below:

FIG. 9 schematically illustrates a semiconductor memory device according to another embodiment of the invention, and, more specifically, a data read circuit for a semiconductor memory device.

As illustrated in FIG. 9, the semiconductor memory device has a structure in which a multi-level bias voltage generator 200 is included in an other wise conventional semiconductor memory device, like the one illustrated in FIG. 2. That is, the semiconductor memory device of FIG. 9 comprises a multi-level bias voltage generator 200, sense amplifier S/A, power source 20, clamping unit 10, column section 40, and cell array block 30.

Multi-level bias voltage generator 200 has a structure in which one sensing section is inserted between two non-sensing sections. In the structure, a plurality of sensing sections and a plurality of non-sensing sections are established, and bias voltages Vbias_out are generated in response to external input voltages Vbias_in. The bias voltage Vbias_out is generated such that the slope of the bias voltage Vbias_out to the input voltage Vbias_in in each of the sensing sections is lower than a slope of the bias voltage Vbias_out to the input voltage Vbias_in in each of the non-sensing sections. An exemplary configuration and operation for multi-level bias voltage generator 200 will now be described in some additional detail with reference to FIGS. 10 and 11.

Here again, the sense amplifier S/A may be implemented using a current sense amplifier or a voltage sense amplifier.

The sense amplifier S/A senses data by comparing a voltage level at a sensing node Nsa connected to a current path PA1, which is formed between the sensing node Nsa and a selected memory cell, and a reference voltage level Vref. For example, when the voltage of the sensing node Nsa which is an input terminal of the sense amplifier S/A is higher than the reference voltage Vref, 'HIGH' is determined and output, and when the voltage of the sensing node Nsa is lower than the reference voltage Vref, 'LOW' is determined and output to an output terminal SAout. When the 'HIGH' is determined, the memory cell M has a high resistance state, and when the 'LOW' is determined, the memory cell M has a low resistance state.

Power source 20 is controlled by the bias voltage Vbias to supply a sensing current Icell to current path PA1. Power source 20 comprises a PMOS transistor PB which is connected between a terminal Vsa, which a source voltage VDD or a voltage with a higher level than the source voltage VDD (hereinafter, called the 'source voltage') is applied to, and the sensing node Nsa.

Clamping unit 10 comprises clamp transistors NC controlled by a clamp signal Vclamp. The clamp transistors NC electrically connect a memory cell selected from array block 30 to the sensing node Nsa of the sense amplifier S/A. Further, the clamp transistors NC maintain a specific voltage level such that the voltage of a bit line BL associated with the selected memory cell array block 30 is within the range of a threshold voltage Vth for the phase-change material being used. Therefore, a level of the clamp signal Vclamp may be suitably set for this clamping function.

Column selecting unit 40 comprises a plurality of column selection transistors N0~Nn switched by column selection signals Y0~Yn. The column selection transistors N0~Nn form the current path PA1 from a bit line BL1, which is connected to the selected memory cell M in the selected cell array block 30, to the sensing node Nsa, which is connected through the clamp transistor NC. That is, the current path PA1 between the sensing node Nsa of the sense amplifier S/A and the memory cell M is formed by the switching operation of the clamp transistors NC and the column selection transistors N0~Nn. For example, when a column selection transistor N1 is turned on by a column selection signal Y1, the current path PA1 is formed between the memory cell M and the sensing node Nsa.

Figure 1:
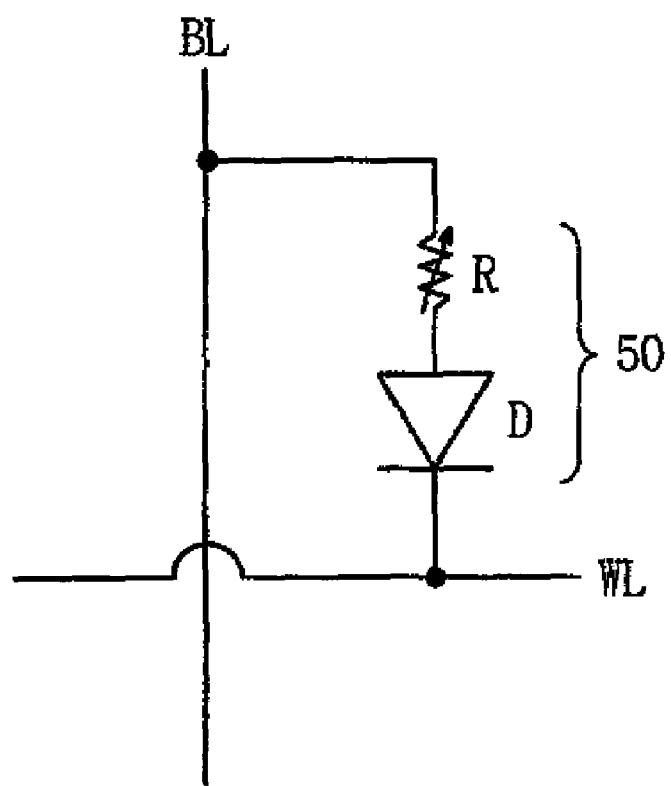
FIG. 1 illustrates a memory cell in a diode structure in a general phase-change random access memory (PRAM)

Cell array block 30 includes memory cells disposed at the intersection of word lines WL0~WLn and bit lines BL0~BLn. The memory cells may have the diode structure, like the one illustrated in FIG. 1. In the working example, the memory cells are assumed to have a structure capable of storing multi-bit data. For example, the memory cells are assumed to have a structure capable of storing 2-bit data, indicted by first data 00, second data 01, third data 10, and fourth data 11. This is, however, just one example of possible multi-bit memory cell structures. Further, the memory cells may be PRAM cells, RRAM cells, or similar memory cells operating with a variable resistance material.

The data read circuit in the semiconductor memory device controls execution of read operations directed to a selected memory cell M in the cell array block 30. When a read command, an address signal, and a clamp signal Vclamp are applied, the clamp signal Vclamp and the column selection signal Y1 are applied so that the current path PA1 is formed between the memory cell M and the sensing node Nsa. Then, the word line connected to the memory cell M maintains a ground level.

After the current path PA1 is formed or at the same time at which the current path PA1 is formed, the bias voltage Vbias_out of a specific level is supplied to current source 20 to supply the current to the current path PA1. Accordingly, the sensing current (or penetrating current) Icell which depends on the resistance value of the memory cell M flows through current path PA1.

The level of sensing current Icell depends on whether the memory cell M stores first data 00, second data 01, third data 10 or fourth data 11. When the memory cell M stores fourth data 11, since it has a high resistance value, a relatively small amount of the sensing current Icell flows through current path PA1. However, when the memory cell M stores first data 00, since it has a low resistance value, a relatively great large level of sensing current Icell flows through the current path PA1. When second data 01 or third data 10 are stored in the memory cell M, the level of sensing current Icell will vary in different amounts between the case of fourth data 11 and the case of first data 00.

The voltage level at the sensing node Nsa which is the input terminal of the sense amplifier S/A changes in relation to the level of current flowing through current path PA1, and the data are sensed by comparing the voltage level at sensing node Nsa with the reference voltage level Vref.

Figure 10:
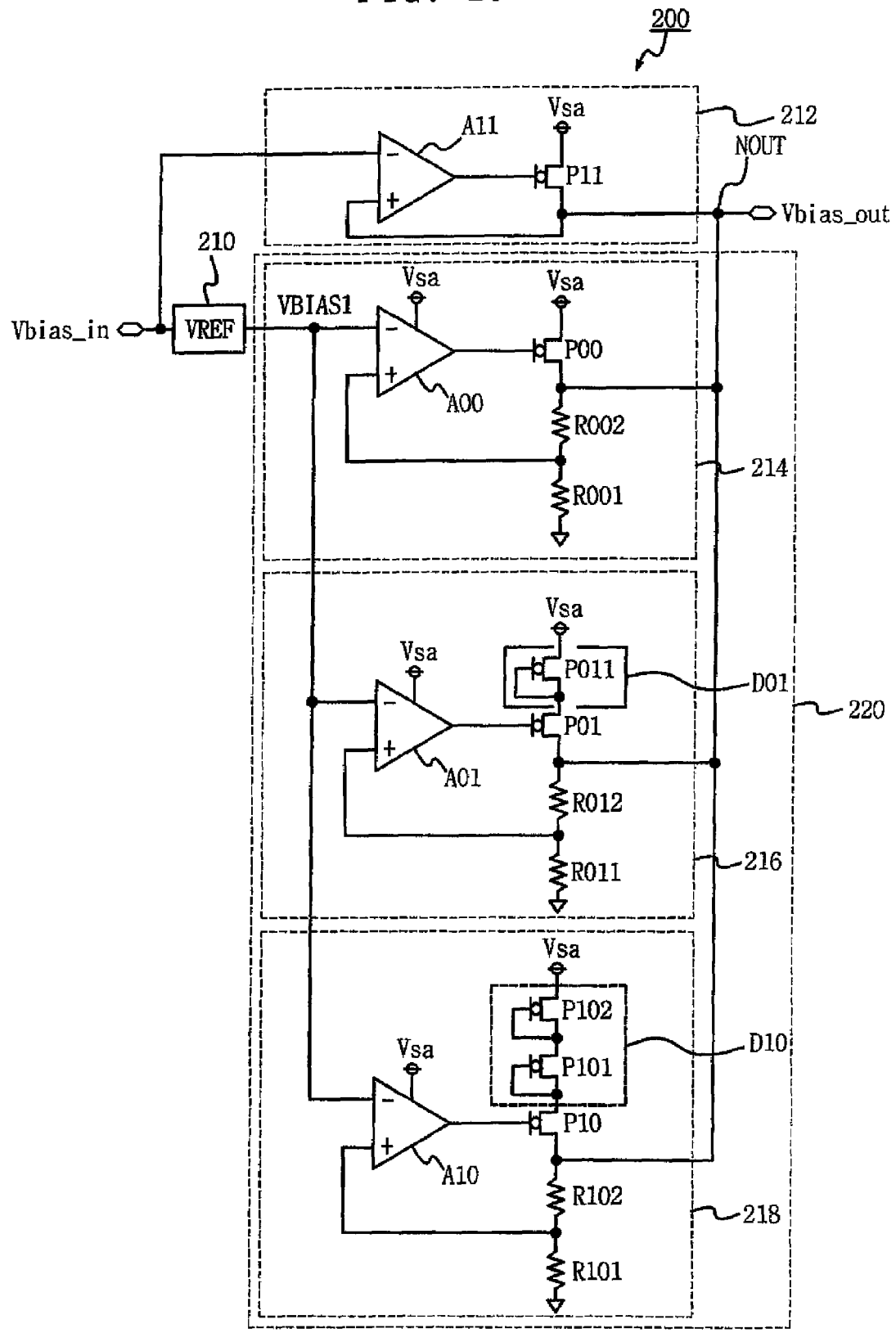
FIG. 10 is a circuit diagram of an example to embody a multi-level bias voltage generator of FIG. 9.

FIG. 10 is a circuit diagram illustrating one embodiment of a possible multi-level bias voltage generator 200 shown in FIG. 9.

As illustrated in FIG. 10, multi-level bias voltage generator 200 comprises a detecting unit 210 and an amplification unit 220. Multi-level bias voltage generator 200 may further comprise a voltage follower circuit 212.

When the input voltage Vbias_in is input at a predetermined first level VREF or above, detecting unit 210 outputs a signal VBIAS1 of clamping the input voltage Vbias_in to the first level or a proximate level to the first level.

The first level VREF may indicate a level for the input voltage Vbias_in which corresponds to the resistance value of the point at which the voltage level at the sensing node Nsa in FIG. 9 becomes the reference voltage level Vref. In other words, the first level VREF may be the level of the input voltage Vbias_in which corresponds to the minimum resistance value R1 of the resistance values being within the sensing range of the first sensing section S1 (for example, within the range of R1 to R2). In another meaning, the first level VREF may indicate a level which is the same as or higher than the voltage level corresponding to the maximum resistance value of the resistance dispersion of first data 00. As an example, when the maximum resistance value in the resistance dispersion of first data 00 is 5KΩ, the first level VREF may be the level of the input voltage Vbias_in which corresponds to the maximum resistance value of 5KΩ. In this embodiment, although the first level VREF is set on the basis of the input voltage Vbias_in, it may be set on the basis of the bias voltage Vbias_out or the output voltage VBIAS1 of detecting unit 210.

Accordingly, until the level of the input voltage Vbias_in becomes the first level VREF, the level of the output signal VBIAS1 of detecting unit 110 increases to be same as the level of the input voltage Vbias_in at a constant slope. When the level of the input voltage Vbias_in is the same as or higher than the first level VREF, the input voltage Vbias_in is clamped to the first level VREF or a proximate level to the first level VREF.

Amplification unit 220 in the illustrated example comprises a plurality of amplification circuits 214, 216 and 218 which correspond respectively to different operation sections. Amplification circuits 214, 216 and 218 may be implemented using OP amplifier circuits capable of controlling gain. The number of amplification circuits 214, 216 and 218 included in amplification unit 220 may be equal to the number of data states corresponding to the number of bits being stored in the multi-bit memory cells, less one. For example, for memory cells having a structure capable of storing 2-bit data in four states, three amplification circuits 214, 216 and 218 are included, as shown in FIG. 10. The gain provided by each amplification circuits 214, 216 and 218 may be the same or different.

Each amplification circuit 214, 216 and 218 amplifies the output signal VBIAS1 provided by detecting unit 210 at an amplification rate depending on each operation section. The output of each amplification circuit 214, 216 and 218 is applied as the bias voltage Vbias_out through one output node NOUT.

Among the amplification circuits 214, 216 and 218 constituting amplification unit 220, first amplification circuit 214 comprises an OP amplifier A00, a PMOS transistor P00 and resistors R001 and R002.

OP amplifier A00 has a connection structure in which the output signal VBIAS1 provided by detecting unit 210 is input in a (−) input terminal and a (+) input terminal forms a feedback loop. The PMOS transistor P00 has a connection structure supplying current to the output node NOUT by control of the output signal of OP amplifier A00. That is, PMOS transistor P00 may have the structure connected between the terminal of the same level Vsa as an operation source level of the OP amplifier A00 and the output node NOUT of the bias voltage Vbias_out. The operation source level Vsa of the OP amplifier A00 may be the level of the source voltage VDD of a general semiconductor memory device or a level VPP being higher than the level of the source voltage VDD.

Resistors R001 and R002 are connected to each other in a series between the output node NOUT of the bias voltage Vbias-out and the ground terminal. The (+) input terminal of the OP amplifier A00 is connected to a connection region of resistors R001 and R002.

First amplification circuit 214 amplifies the output signal VBIAS1 of detecting unit 210 at the rate of (1+R002/R001). That is, the output signal of first amplification circuit 214 is '(1+R002/R001)*(VBIAS1)'. First amplification circuit 214 immediately amplifies the output signal VBIAS1 of detecting unit 210 to be output without a delay.

Resistors R001 and R002 serve to determine the slope of the bias voltage Vbias_out to the output signal VBIAS1 of detecting unit 210. That is, the resistance rate between resistors R001 and R002 determines the gain which is the amplification rate of the output signal VBIAS1 of detecting unit 210. Therefore, the slope of the bias voltage Vbias_out is controllable by differentiating the resistance value rates of resistors R001 and R002. The resistance value rate may be controlled by cutting a fuse and the like, during a wafer state or a package state of the semiconductor memory device.

Among amplification circuits 214, 216 and 218 forming amplification unit 220, second amplification circuit 216 comprises an OP amplifier A01, a PMOS transistor P01, a delay circuit D01 and resistors R011 and R012. Second amplification circuit 216 has the same connection structure as first amplification circuit 214, except for the delay circuit D01 which is additionally connected between the PMOS transistor P01 and the terminal for applying the same level Vsa as the operation source voltage level. The "same connection structure" means that only the structures are similar to each other and does not mean that the internal resistance value of the structure or the gain are the same.

Delay circuit D01 comprises a diode using the PMOS transistor P011 and delays the operation of second amplification circuit 216. That is, delay circuit D01 delays the operation of second amplification circuit 216 by a section d1 until the input voltage Vbias_in becomes the level of the threshold voltage Vthp of the diode P011 constituting the delay circuit D01. Therefore, the delay section d1 of the second amplification circuit 216 is controllable by controlling the threshold voltage Vthp of the diode P011. Otherwise, a separate delay circuit may be added to second amplification circuit 216.

Second amplification circuit 216 amplifies the output signal VBIAS1 of detecting unit 210 at the rate of (1+R012/R011). That is, the output signal amplified by second amplification circuit 216 is '(1+R012/R011)*(VBIAS1)'. Second amplification circuit 216 amplifies the output signal VBIAS1 of detecting unit 210 after the certain delay d1 and outputs the amplified output signal.

Resistors R011 and R012 act as the elements of determining the slope of the bias voltage Vbias_out to the output signal VBIAS1 provided by detecting unit 210. That is, the resistance rate between the resistors R011 and R012 determines the gain which is the amplification rate of the output signal VBIAS1 of detecting unit 210. Therefore, the slope of the bias voltage Vbias_out is controllable by differentiating the resistance value rate between the resistors R011 and R012, and the output of the bias voltage Vbias_out is also controllable. The resistance value rate may be set by cutting a fuse and the like during a wafer state or a package state for the semiconductor memory device.

Among amplification circuits 214, 216 and 218 forming amplification unit 220, third amplification circuit 218 comprises an OP amplifier A10, a PMOS transistor P10, a delay circuit D10 and resistors R101 and R102. The third amplification circuit 218 has the same connection structure as second amplification circuit 216, except for the delay circuit D10 which comprises two series connected diodes P101 and P102. The same connection structure means that only the structure is similar to each other and does not mean that the internal resistance value of the structure or the gain is same to each other.

Delay circuit D10 comprises two diodes using two PMOS transistors P101 and P102 and delays the operation of third amplification circuit 218. That is, the delay circuit D10 delays the operation of third amplification circuit 218 by a section d1+d2 which is the sum total of the level of the threshold voltage Vthp of the diodes P101 and P102 constituting the delay circuit D10. Therefore, the delay section d1+d2 of third amplification circuit 218 is controllable by controlling the threshold voltage Vthp of the diodes P101 and P102 constituting delay circuit D10. Otherwise, a separate delay circuit may be added to third amplification circuit 218.

Third amplification circuit 218 amplifies the output signal VBIAS1 provided by detecting unit 210 at the rate of (1+R102/R101). The output signal amplified by third amplification circuit 218 is '(1+R102/R101)*(VBIAS1)' Third amplification circuit 218 amplifies the output signal VBIAS1 of detecting unit 210 after the certain delay d1+d2 and outputs the amplified output signal.

Resistors R101 and R102 serve to determine the slope of the bias voltage Vbias_out to the output signal VBIAS1 of detecting unit 210. That is, the resistance rate between resistors R101 and R102 determines the gain which is the amplification rate of the output signal VBIAS1 of detecting unit 210. Therefore, the slope of the bias voltage Vbias_out is controllable by differentiating the resistance value rate between the resistors R101 and R102, and the output of the bias voltage Vbias_out is also controllable. The resistance value rate may be set by cutting a fuse and the like during a wafer state or a package state for semiconductor memory device.

Voltage follower circuit 212 comprises an OP amplifier A11 and a PMOS transistor P11. When the level of the input voltage Vbias_in is greater than the level of the bias voltage Vbias_out, voltage follower circuit 212 outputs the input voltage Vbias_in to the output node NOUT without addition or subtraction. Since voltage follower circuit 212 is well known to those skilled in the art, no description of the constitution or operation thereof will be presented.

Figure 11:
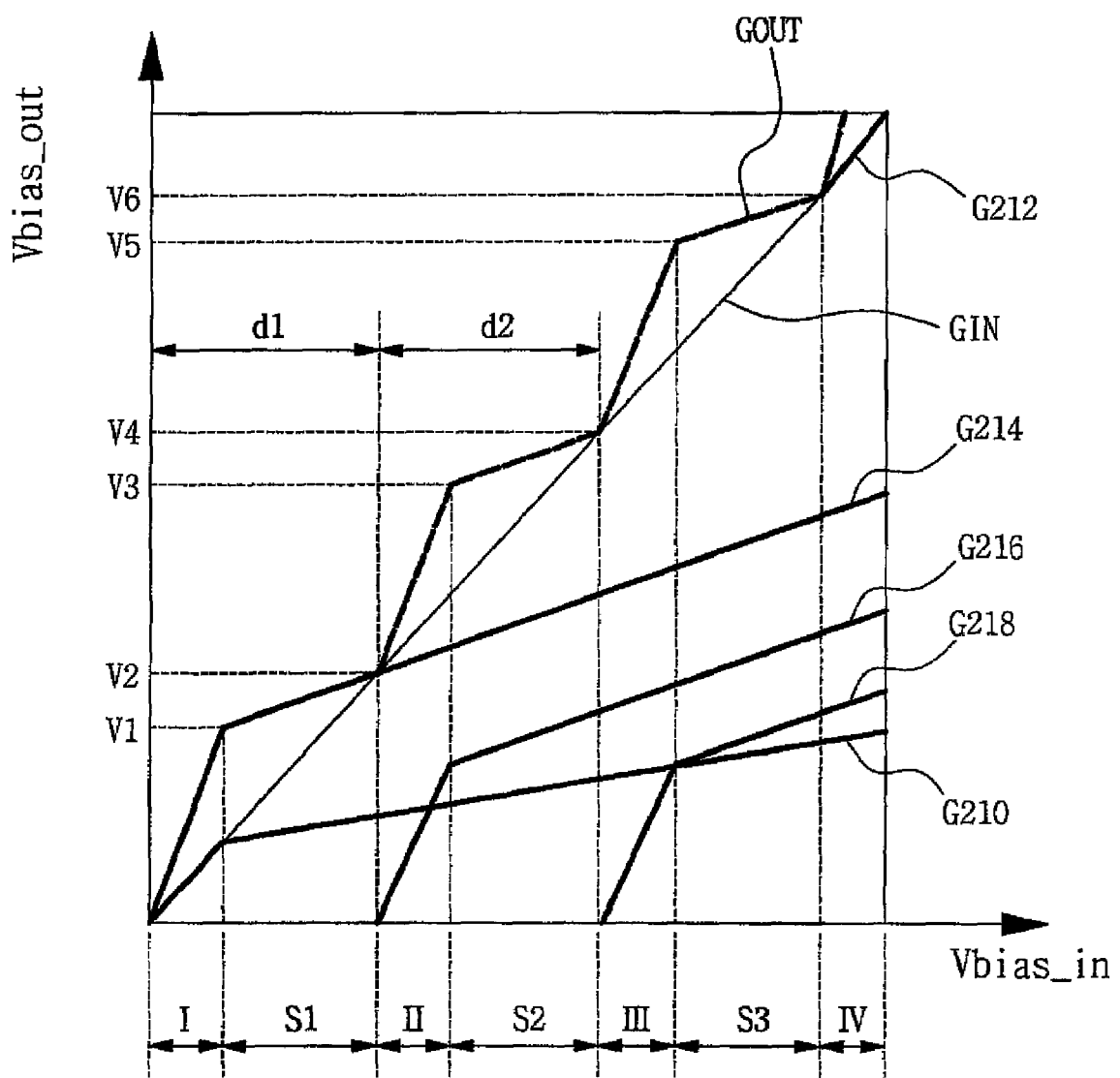
FIG. 11 shows graphs representing an output by each block of FIG. 10.

FIG. 11 is a graph pf various plots showing the output by each block and the bias voltage Vbias_out relative to the input voltage Vbias_in of FIG. 10.

Sensing sections S1, S2 and S3 and non-sensing sections I, II, III and IV are defined for clarity. A level section of the input voltage Vbias_in corresponding to the distribution section of first data 00 is defined as a first section I. The first section I may mean the section in which the level of the input voltage Vbias_in is below the first level VREF.

A level section of the input voltage Vbias_in corresponding to the distribution section of second data 01 is defined as a second section II. The section between the first section I and the second section II is defined as a first sensing section S1. A level section of the input voltage Vbias_in corresponding to the distribution section of third data 10 is defined as a third section III. The section between the second section II and the third section III is defined as a second sensing section S2. Finally, a level section of the input voltage Vbias_in corresponding to the distribution section of fourth data 11 is defined as a fourth section IV. The section between the third section III and the fourth section IV is defined as a third sensing section S3.

The sensing sections S1, S2 and S3 and the non-sensing sections I, II, III and IV may be defined based on the level of the bias voltage Vbias_out. That is, the section in which the level of the bias voltage Vbias_out may be defined as a first voltage V1 or below may be defined as the first section I, and the level section between the first voltage V1 and a second voltage V2 may be defined as the first sensing section S1. Further, the level section between the second voltage V2 and a third voltage V3 may be defined as the second section II, and the level section between the third voltage V3 and a fourth voltage V4 may be defined as the second sensing section S2. Next, the level section between the fourth voltage V4 and a fifth voltage V5 may be defined as the third section III, and the level section between the fifth voltage V5 and a sixth voltage V6 may be defined as the third sensing section S3. Further, the section in which the level of the bias voltage Vbias_out is the sixth voltage V6 or above may be defined as the fourth section IV.

The sensing sections S1, S2 and S3 and the non-sensing sections I, II, III and IV are independently controllable by including an additional circuit which is capable of controlling the resistance values of amplification unit 220 or controlling the resistance values by reaction to an operation temperature. Additionally, it is assumed that second amplification circuit 216 of FIG. 10 including delay d1 does not operate before the first sensing section S1, and that third amplification circuit 218 including delay d1+d2 does not operate until the second sensing section S2. That is, it is assumed that second amplification circuit 216 starts operating from the second section II and third amplification circuit 218 starts operating from the third section III. Between the above sections, the amplification circuits may have different delays, as necessary.

In FIG. 11, there are provided a plot GIN of the input voltage Vbias_in, a plot G210 of the output signal VBIAS1 provided by detecting unit 210, a plot G214 of the output signal of first amplification circuit 214, a plot G216 of the output signal of second amplification circuit 216, a plot G218 of the output signal of third amplification circuit 218, a plot G212 of the output signal of the voltage follower 212, and a plot GOUT of the bias voltage Vbias_out which is the final output signal of bias voltage generator 200. Here, it is assumed that the input voltage Vbias_in is applied with a linear, constant slope as shown in plot GIN.

In the first section I, only detecting unit 210 and first amplification circuit 214 operate. As the input voltage Vbias_in is applied with a constant slope, detecting unit 210 outputs the output signal VBIAS1 of the same level as that of the input voltage Vbias_in. Therefore, in the first section I, the output signal VBIAS1 provided by detecting unit 210 is same as the input signal Vbias_in.

Then, first amplification circuit 214 amplifies the output signal VBIAS1 provided by detecting unit 210 at the predetermined rate of (1+R002/R001) and outputs the amplified the output signal. Accordingly, the output signal of amplification unit 220 in the first section I has a greater slope than that of the output signal VBIAS1 of detecting unit 210. The slope of the output signal of amplification unit 220 in the first section I is controllable by changing the rate of the resistance value in first amplification circuit 214 constituting the amplification unit 220.

Next, in the first sensing section S1 like the first section I, only detecting unit 210 and first amplification circuit 214 operate. At the same time when the input voltage Vbias_in reaches the first level VREF, as indicated by plot G210, detecting unit 210 outputs the output signal VBIAS1 by clamping the input voltage Vbias_in to the first level VREF or a proximate level to the first level VREF. That is, the slope of the output signal VBIAS1 provided by detecting unit 210 in the other sections except for the first section I may have an almost '0' value or a proximate value to '0'.

The first level VREF acts as an important element of determining the sensing margin of the bias voltage Vbias_out. That is, the first level VREF functions as the voltage level to distinguish the first section I from the first sensing section S1. Therefore, the first level VREF may be changed to a proper level if necessary or depending on the operation temperature of the semiconductor memory device.

Then, first amplification circuit 214 amplifies the output signal VBIAS1 provided by detecting unit 210 at the predetermined rate of (1+R002/R001) and outputs the amplified output signal. Accordingly, as indicated by the plot G214, the output signal of amplification unit 220 in the first sensing section S1 has a lower slope than the output of amplification unit 220 in the first section I. This is to broaden the range of the input voltage Vbias_in for the first sensing section S1, that is, to increase the sensing margin. The slope of the output signal of amplification unit 200 in the first sensing section S1 is controllable by changing the rate of the resistance value in first amplification circuit 214 which constitutes the amplification unit 220.

In the first section I and the first sensing section S1, since only detecting unit 210 and first amplification circuit 214 operate, the output of first amplification circuit 214 is the bias voltage Vbias_out which is the final output of bias voltage generator 200.

Next, in the second section II, detecting unit 210, first amplification circuit 214 and second amplification circuit 216 operate. Therefore, the bias voltage Vbias_out being output to the output node NOUT in the second section II is the sum total of the output of first amplification circuit 214 and second amplification circuit 216. That is, the output signal VBIAS1 provided by detecting unit 210 is applied to amplification unit 220 by being clamped to the first level VREF or the proximate level to the first level VREF.

Then, first amplification circuit 214 amplifies the output signal VBIAS1 of detecting unit 210 at the predetermined rate of (1+R002/R001) and outputs the amplified output signal. Since the output signal VBIAS1 is amplified at the predetermined rate, the output of first amplification circuit 214 maintains a similar shape while differing from the level of the output signal VBIAS1 provided by detecting unit 210.

Second amplification circuit 216 starts operating in the second section II and amplifies the output signal VBIAS1 provided by detecting unit 210 in the first section I at a predetermined rate (1+R012/R011) and outputs the amplified output signal, similarly to the operation of first amplification circuit 214 in the first section I. Accordingly, as indicated by the plot G216, the output signal of second amplification circuit 216 in the second section II has a greater slope compared to the output signal VBIAS1 provided by detecting unit 210 in the first section I. Further, the output signal of second amplification circuit 216 in the second section II has the similar shape to the output signal of first amplification circuit 214 in the first section I. In other words, the output of second amplification circuit 216 is different from the output of first amplification circuit 214 only in its respective amplification rate. Therefore, the output of second amplification circuit 216 has the shape obtained by shifting the output of first amplification circuit 214 to the right in FIG. 11.

When the resistance value rate of the resistors constituting second amplification circuit 216 is same as that of the resistors constituting first amplification circuit 214, the output of second amplification circuit 216 in the second section II becomes the same as the output of first amplification circuit 214 in the first section I.

The slope of the output signal of amplification unit 220 in the second section II is controllable by changing the rate of the resistance value in second amplification circuit 216 constituting amplification unit 220.

Accordingly, as indicated by the plot GOUT, the bias voltage Vbias_out, —that is, the final output through the output node NOUT—in the second section II is the sum total of the output of first amplification circuit 214 and second amplification circuit 216.

Further, in the second sensing section S2, like the second section II, only detecting unit 210, first amplification circuit 214 and second amplification circuit 216 operate. Thus, in the second sensing section S2, as indicated by the plot G216, since second amplification circuit 216 amplifies the output signal provided by detecting unit 210 being clamped to the first level VREF or the proximate level to the first level VREF, the output signal of second amplification circuit 216 has a relatively low slope, compared with the second section II. Further, first amplification circuit 214 continuously outputs a signal with constant slope, except for first section I.

Therefore, in the second sensing section S2, since detecting unit 210, first amplification circuit 214 and second amplification circuit 216 operate, the sum total of the output of first amplification circuit 214 and second amplification circuit 216 becomes the bias voltage Vbias_out which is the final output of bias voltage generator 200. The bias voltage Vbias_out in the second sensing section S2 has a lower slope than that of the bias voltage Vbias_out in the second section II, and the slope of the bias voltage Vbias_out in the second sensing section S2 is same as or similar to that of the bias voltage Vbias_out in the first sensing section S1 while these are different in the voltage level.

In the third section III, third amplification circuit 218 starts to additionally operate. The point at which third amplification circuit 218 begins operation may be determined according to specific design objectives. Therefore, in the third section III, detecting unit 210 and first, second and third amplification circuits 214, 216 and 218 operate.

Therefore, as indicated by the plot G218, the output of third amplification circuit 218 from the third section III may have a shape obtained by shifting the output of first amplification circuit 214 or the output of the second amplification circuit 216 to the right as shown in FIG. 11, by differentiating the amplification rate.

When the resistance value rate of the resistors constituting third amplification circuit 218 is same as that of the resistors constituting first amplification circuit 214 or second amplification circuit 216, the output of third amplification circuit 218 from the third section III may be same as the output of first amplification circuit 214 from the first section I or the output of second amplification circuit 216 from the second section II.

The slope of the output signal for amplification unit 220 in the third section III is controllable by changing the rate of the resistance value in third amplification circuit 218 constituting amplification unit 220.

Accordingly, as indicated by the plot group GOUT, the bias voltage Vbias_out, that is, the final output through the output node NOUT, in the third section III is the sum total of the output of first amplification circuit 214, second amplification circuit 216 and third amplification circuit 218.

Further, in the third sensing section S3, like the third section III, detecting unit 210, first amplification circuit 214, second amplification circuit 216 and third amplification circuit 218 operate.

As indicated by the plot G218, since third amplification circuit 218 amplifies the output signal provided by detecting unit 210 being clamped to the first level VREF or the proximate level to the first level VREF, the output signal of third amplification circuit 218 in the third sensing section S3 has a relatively low slope, as compared with the third section III. Further, first amplification circuit 214 and second amplification circuit 216 continuously provide outputs at their respective constant slopes, except for the first section I or the second section II.

Therefore, in the third sensing section S3, the sum total of the output of first amplification circuit 214, second amplification circuit 216 and third amplification circuit 218 becomes the bias voltage Vbias_out which is the final output of bias voltage generator 200. The bias voltage Vbias_out in the third sensing section S3 has a lower slope than that of the bias voltage Vbias_out in the third section III, and the slope of the bias voltage Vbias_out in the third sensing section S3 is same as or similar to that of the bias voltage Vbias_out in the first sensing section S1 or the second sensing section S2 while these are different in the voltage level.

Finally, in the fourth section IV, unlike the other sections, voltage follower circuit 212 operates. Therefore, in the fourth section IV, all circuits constituting the exemplary bias voltage generator 200 operate. Voltage follower circuit 212 may be designed to operate when the input voltage Vbias_in has a higher level than the bias level Vbias_out which is the voltage of the output node NOUT. Like the plots GOUT and GIN, since the bias voltage Vbias_out maintains the higher level than the input voltage Vbias_in in the previous sections I, II, III, S1, S2 and S3, voltage follower circuit 212 does not operate.

Voltage follower circuit 212 outputs the input voltage Vbias_in without addition or subtraction. This may be seen from the plot G212 representing the output of voltage follower circuit 212.

In the fourth section IV, as indicated by the plot GOUT, the bias voltage Vbias_out being output from bias voltage generator 200 has the level equal to the summation of outputs from first amplification circuit 214, second amplification circuit 216, third amplification circuit 218 and voltage follower circuit 212 in the fourth section IV. Therefore, the bias voltage Vbias_out in the fourth section IV has a higher (greater) slope, as compared with the first, second and third sections I, II and III.

Figure 12:
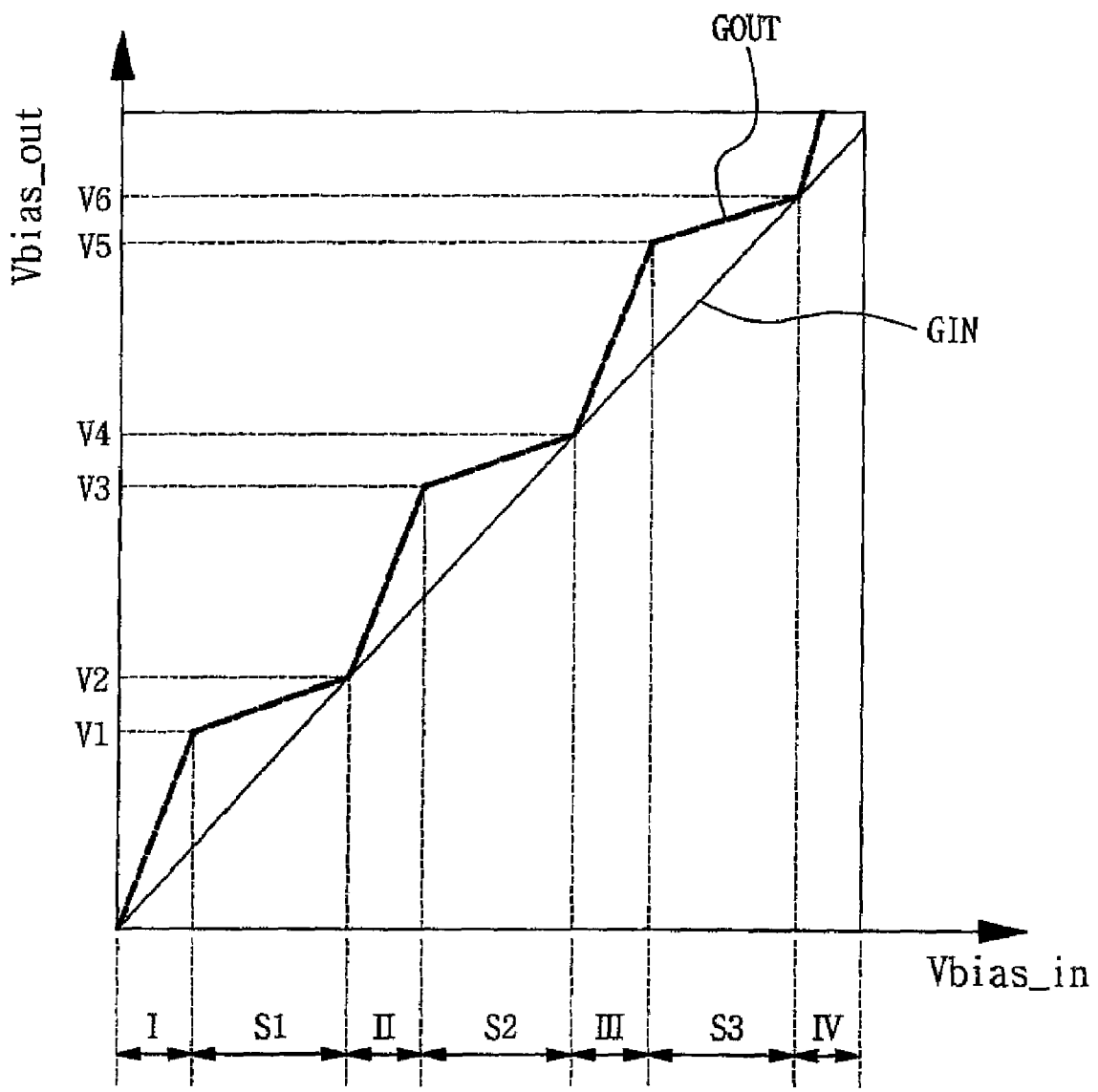
FIG. 12 is a graph representing a bias voltage as a final output of FIG. 10.

The plots GIN and GOUT of the bias voltage Vbias_out to the input voltage Vbias-in in each section are further illustrated in FIG. 12. As may be seen from FIG. 12, the bias voltage Vbias_out has lower slopes in the sensing sections S1, S2 and S3 than the non-sensing sections I, II, III and IV, to increase the sensing margin.

Figure 13:
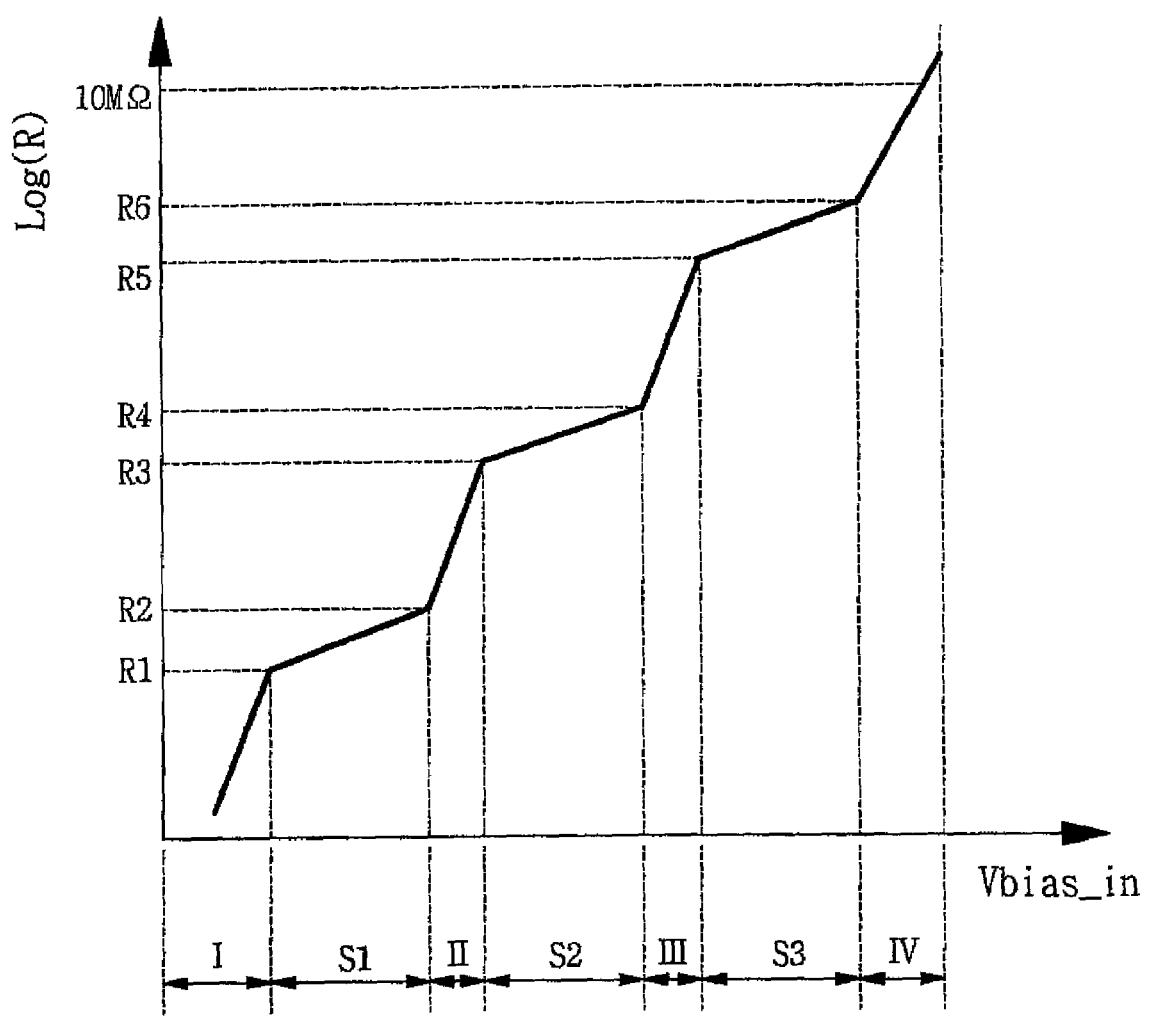
FIG. 13 is a graph representing a resistance value of an input voltage of FIG. 10.

FIG. 13 is a Log scale graph representing the resistance value of the point at which the voltage level of the sensing node Nsa of FIG. 9 becomes the reference voltage level Vref to the input voltage Vbias_in when applying bias voltage generator 200. As can be seen from FIG. 13, the resistance values have lower slopes in the sensing sections S1, S2 and S3 than the non-sensing sections I, II, III and IV, to increase the sensing margin. The difference is apparently upon comparing FIG. 4.

Figure 4:
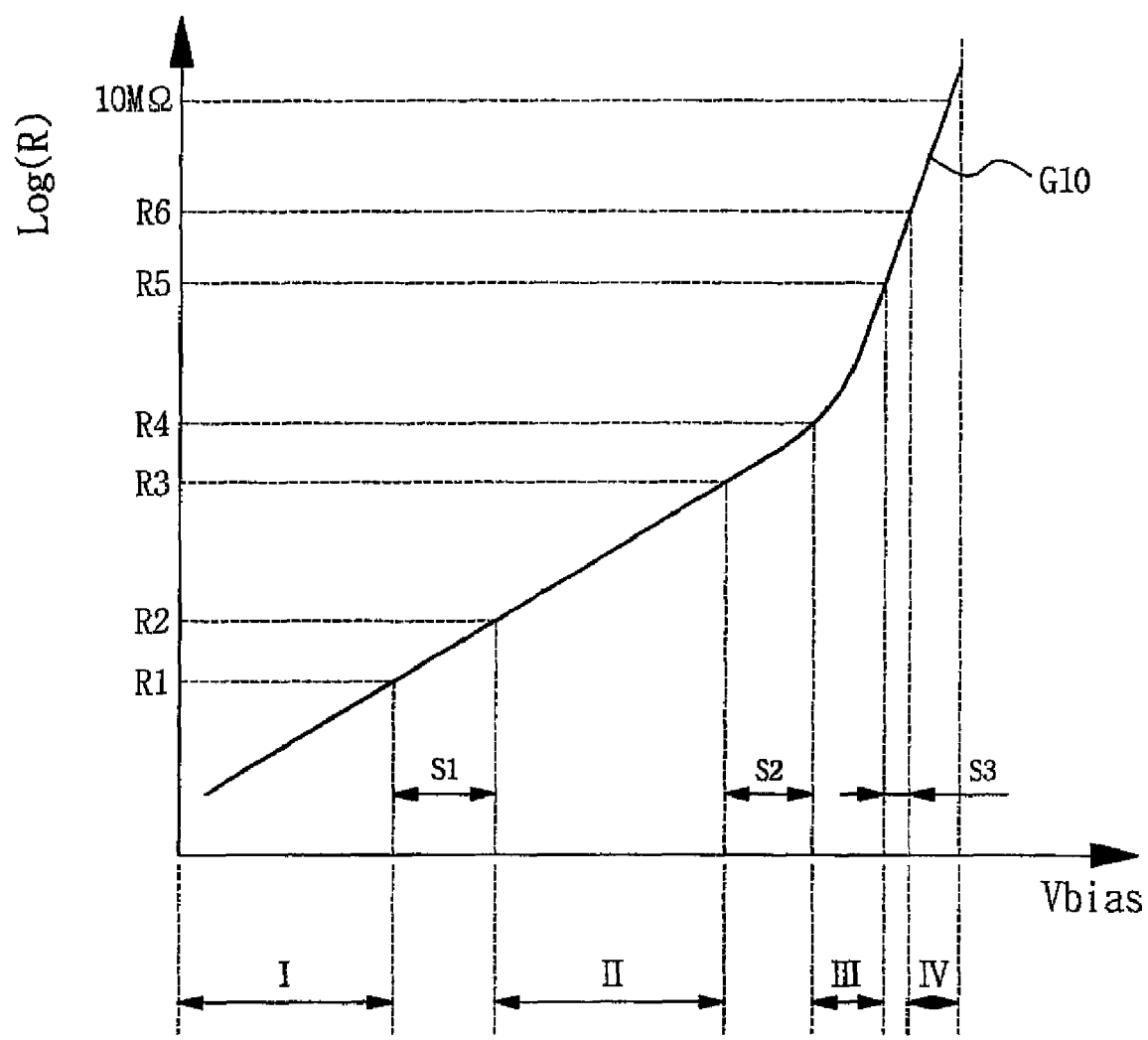
FIG. 4 is a graph representing a resistance value corresponding to a bias voltage when sensing multi-bit data of FIG. 2.

That is, assuming that the input voltage Vbias in FIG. 4 is same as the input voltage Vbias_in in FIG. 13, it is noted that the sensing sections S1, S2 and S3 of FIG. 13 are significantly broadened as compared with those of FIG. 4. This means that the sensing margin for sensing each bit data is increased. As one example, to sense first data 00 from other data 01, 10 and 11, whereas the specific input voltage Vbias belonging to the first sensing section S1 in FIG. 4 needs to be applied as the bias voltage, the specific input voltage Vbias_in belonging to the first sensing section S1 in FIG. 13 needs to be applied to bias voltage generator 200. In this case, when the sensing section is relatively large, the range of the input voltage Vbias_in is correspondingly large and the sensing margin is relatively large.

A bigger difference may be noted relative to the third sensing section S3. In FIG. 4, the third sensing section S3 is very narrow and the corresponding sensing margin is too small. However, in FIG. 13, the third sensing section S3 has been significantly enlarged, and the corresponding sensing margin increased.

Figure 14:
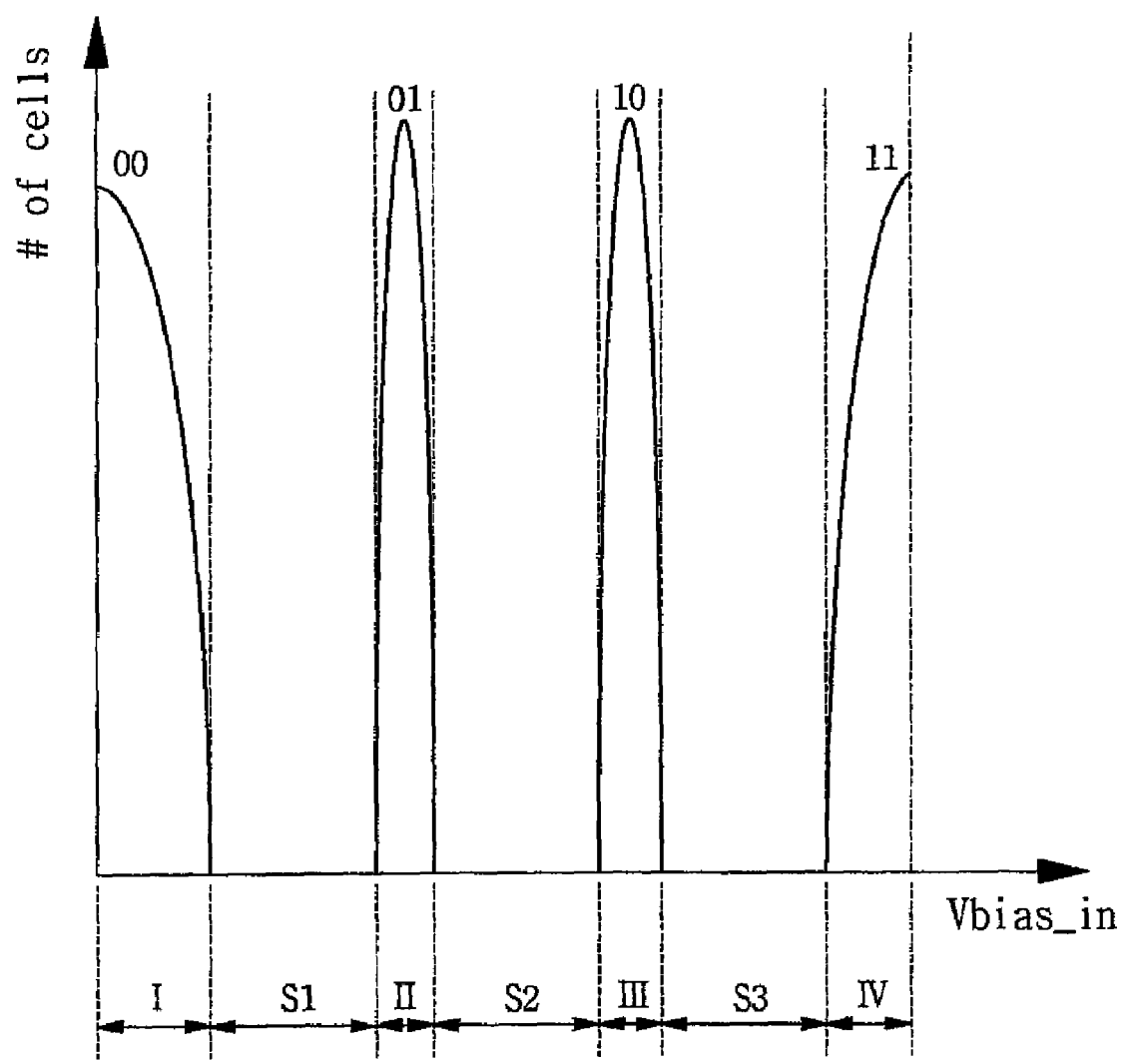
FIG. 14 illustrates dispersion by each bit data to an input voltage after a verification operation.

FIG. 14 is a resulting distribution for data 00, 01, 10 and 11 corresponding to the input bias voltage Vbias_in when a verification operation is performed following a data write operation before reading data from a selected memory cell. The write verification operation is widely used as a method for uniformly dispersing data being stored in the memory cell to increase the sensing margin.

That is, even though the data being stored in the memory cell has the same data state, the distribution of resistance values of the data is not uniform. As a result, since the reliability of the writing or reading operation is not ensured, the writing verification operation is mainly performed. Since the writing verification operation is well know to those skilled in the art, no description thereof will be presented.

Figure 5:
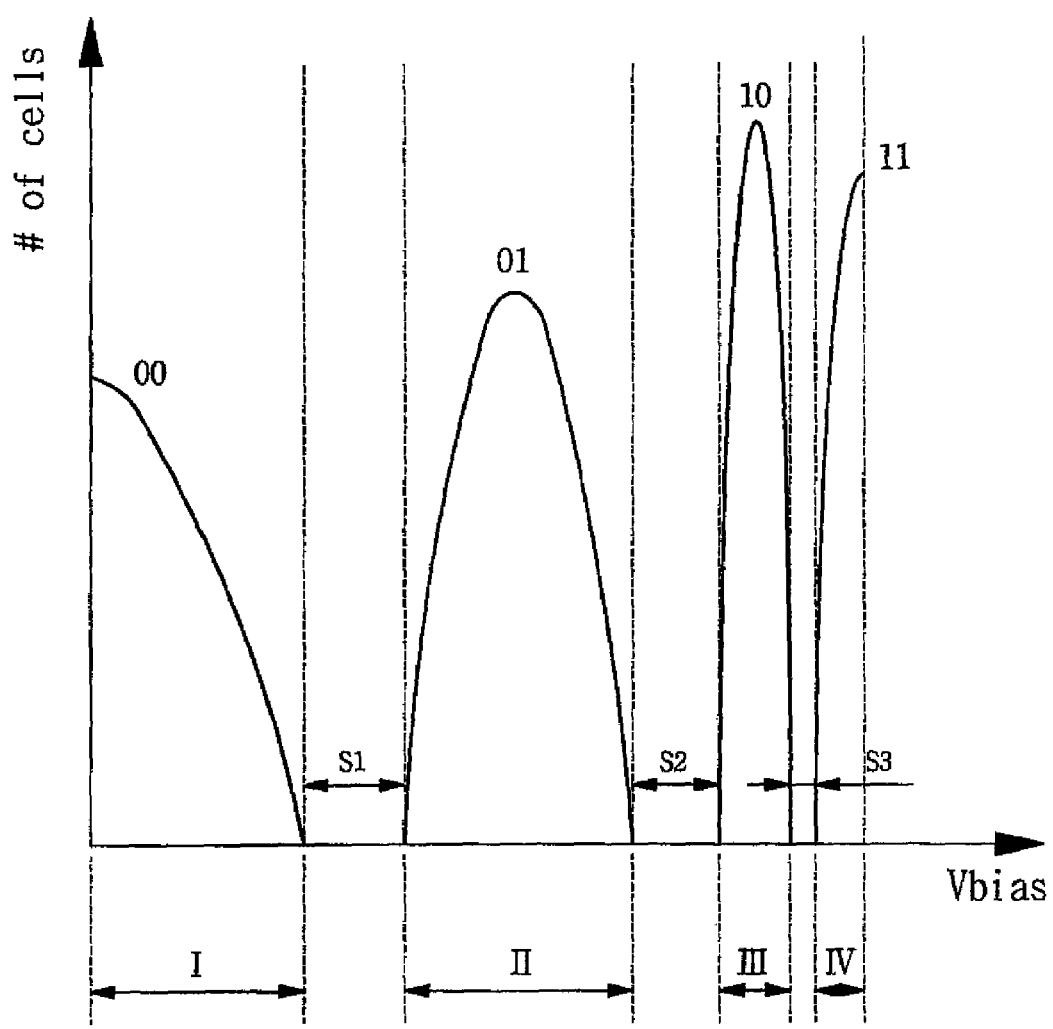
FIG. 5 is a distribution of data by each bit corresponding to an input bias voltage of FIGS. 2 and 4.

As illustrated in FIG. 14, since the write verification operation is performed, it is noted that the resistance dispersion for data 00, 01, 10 and 11 is much more uniform as compared with FIG. 5. Accordingly, the sensing sections S1, S2 and S3 are significantly broad, as compared with the example of FIG. 5.

Therefore, irrespective of memory cell type, a multi-level bias generator may be provided to increase sensing margin of the bias voltage during a read operation. Further, when a write verification operation is performed following a write operation to the memory cell, a greater sensing margin may also be obtained.

The above description of embodiments has been made in relation to PRAM examples. However, the present invention is applicable to all semiconductor memory devices having a structure capable of sensing data stored in a memory cell by using a variable resistance value, Such semiconductor memory devices include both diode structure and transistor structures and further include, at a minimum PRAM, RRAM and MRAM devices.

As described above, in accordance with embodiments of the invention, the input range for an input voltage is broadened by differentiating the slope of the bias voltage to be input to the power source so that the sensing margin may be increased, and the sensing margin of the bias voltage is controlled by controlling the resistance value or the first level value and the second level value. In addition, the resolution of the resistance dispersion curve may be improved. Furthermore, when a verification operation is performed following a write operation to the memory cell, the sensing margin may be significantly increased. Furthermore, the sensing margin may be independently controlled.

The invention has been described using preferred exemplary embodiments. However, it is to be understood that the scope of the invention is not limited to the illustrated embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

What is claimed is:

1. A bias voltage generator generating a bias voltage to control a sensing current supplied to a memory cell, comprising:
   a circuit providing the bias voltage in response to an applied input voltage, such that the non-zero slope of the bias voltage relative to the input voltage is different for at least two successive sections of the input voltage distinguished different voltage levels.

2. The bias voltage generator of claim 1, wherein the at least two sections are distinguished in relation to a first level, and the slope of the bias voltage in a first section, wherein the level of the input voltage is less than the first level, is lower than the slope of the bias voltage in a second section, wherein the level of the input voltage is greater than or equal to the first level.

3. The bias voltage generator of claim 2, comprising:
   a detecting unit providing an output, wherein the output is the input voltage without addition or subtraction in the first section, and the output is the input voltage clamped to the input voltage or a level proximate the first level in the second section; and
   an amplification unit outputting the bias voltage by amplifying the output of the detecting unit.

4. The bias voltage generator of claim 3, wherein the slope of the bias voltage relative to the input voltage is different for at least four sections of the input voltage including
   the first section and the second section, wherein the second section corresponding to an input voltage level less than a second level higher than the first level; and
   a third section corresponding to an input voltage level greater than the second level.

5. The bias voltage generator of claim 4, wherein the slope of the bias voltage in the second section is lower than the slope of the bias voltage in the first section and the third section.

6. The bias voltage generator of claim 5, further comprising:
   a compensation unit operating only in the third section to increase the level of the bias voltage in proportion to a voltage difference between the level of the input voltage and the second level.

7. The bias voltage generator according to claim 6, wherein the sensing current is supplied to a current path formed between the memory cell and a sensing node for a sense amplifier associated with the memory cell.

8. The bias voltage generator according to claim 7, wherein the bias voltage is applied to the gate of a PMOS transistor connected between the sensing node and a source voltage terminal controlling the sensing current.

9. The bias voltage generator according to claim 2, wherein relative to the second section, the bias voltage is generated in a range defined by a voltage level corresponding to a maximum resistance value associated with set data stored in the memory cell and a voltage level corresponding to a minimum resistance value associated with reset data stored in the memory cell.

10. A semiconductor memory device comprising:
    a memory cell characterized by different resistance values defined by different data values stored in the memory cell;
    a sense amplifier sensing a stored data value in accordance with a level of current or voltage associated with a current path formed between a sensing node and the memory cell;
    a power source controlled by a bias voltage and supplying a sensing current to the current path; and
    a bias voltage generator outputting the bias voltage in response to an applied input voltage by controlling the slope of the bias voltage relative to defined sections distinguished by the level of the input voltage.

11. The semiconductor memory device of claim 10, wherein the bias voltage in a section is generated in a range defined by a voltage level corresponding to a maximum resistance value associated with set data stored in the memory cell and a voltage level corresponding to a minimum resistance value associated with reset data stored in the memory cell.

12. The semiconductor memory device of claim 11, wherein the power source comprises a PMOS transistor connected between a source voltage terminal or a source terminal having a level greater than the source voltage and the sensing node.

13. A method of generating a bias voltage to control a sensing current supplied to a memory cell, comprising:
    outputting the bias voltage in response to an applied input voltage by controlling the slope of the bias voltage in relation to a plurality of sections respectively defined in relation to the level of the input voltage.

14. The method of claim 13, wherein the sensing current is supplied to a current path formed between the memory cell and a sensing node of a sense amplifier associated with the memory cell and the bias voltage is applied to the gate of a PMOS transistor connected between the sensing node and a source voltage terminal so as to control the sensing current.

15. The method of claim 14, wherein the bias voltage in at least one of the plurality of sections is generated in a range defined by a voltage level corresponding to a maximum resistance value associated with set data stored in the memory cell and a voltage level corresponding to a minimum resistance value associated with reset data stored in the memory cell.

16. A multi-level bias voltage generator generating a plurality of bias voltages to control a sensing current supplied to a memory cell storing multi-bit data, comprising:
    a circuit defining a sensing section selected from a plurality of sensing sections between two non-sensing sections selected from a plurality of non-sensing sections, wherein each one of the plurality of sensing sections corresponds to a bias voltage having a different slope selected from the plurality of bias voltages and corresponding to a level of an applied input voltage, such that the slope of the bias voltage in each sensing section is lower than the slope of the bias voltage in each non-sensing section.

17. The multi-level bias voltage generator of claim 16, comprising:
- a detecting unit outputting the input voltage by clamping the input voltage to a predetermined first level when the level of the input voltage is the same as or higher than a first level; and
- an amplification unit including a plurality of amplification circuits having different operation sections, the amplification unit outputting the plurality of bias voltages by amplifying the output provided by the detecting unit for each one of the plurality of sections.

18. The multi-level bias voltage generator of claim 17, further comprising:
- a voltage follower circuit outputting a voltage during at least one section in the plurality of sections.

19. The multi-level bias voltage generator of claim 18, wherein the sensing current is supplied to a current path formed between the memory cell and a sensing node of a sense amplifier associated with the memory cell and the bias voltage is applied to the gate of a PMOS transistor connected between the sensing node and a source voltage terminal so as to control the sensing current.

20. The multi-level bias voltage generator of claim 19, wherein at least one of the plurality of non-sensing sections is generated in a range defined by a voltage level corresponding to a maximum resistance value associated with set data stored in the memory cell and a voltage level corresponding to a minimum resistance value associated with reset data stored in the memory cell and each one of the plurality of sensing sections is positioned between adjacent ones of the plurality of non-sensing sections.

* * * * *